(12) United States Patent
Udrea et al.

(10) Patent No.: US 8,482,031 B2
(45) Date of Patent: Jul. 9, 2013

(54) LATERAL INSULATED GATE BIPOLAR TRANSISTORS (LIGBTS)

(75) Inventors: Florin Udrea, Cambridge (GB); Vasantha Pathirana, Cambridge (GB); Tanya Trajkovic, Cambridge (GB); Nishad Udugampola, Papworth Everard (GB)

(73) Assignee: Cambridge Semiconductor Limited, Cambridge (GB)

( * ) Notice: Subject to any disclaimer, the term of this patent is extended or adjusted under 35 U.S.C. 154(b) by 830 days.

(21) Appl. No.: 12/648,818

(22) Filed: Dec. 29, 2009

(65) Prior Publication Data

US 2011/0057230 A1    Mar. 10, 2011

Related U.S. Application Data

(60) Provisional application No. 61/240,780, filed on Sep. 9, 2009.

(51) Int. Cl.
*H01L 29/739* (2006.01)
*H01L 21/761* (2006.01)
*H01L 21/331* (2006.01)

(52) U.S. Cl.
USPC ............ 257/141; 257/E29.197; 257/E21.544; 257/E21.382

(58) Field of Classification Search
USPC ............ 257/141, E29.197, E21.544, E21.382
See application file for complete search history.

(56) References Cited

U.S. PATENT DOCUMENTS

| | | | |
|---|---|---|---|
| 5,253,156 A | 10/1993 | Sakurai et al. | |
| 7,737,524 B2 * | 6/2010 | Letavic | 257/488 |
| 2008/0303057 A1 | 12/2008 | Iwamuro | |

FOREIGN PATENT DOCUMENTS

DE    40 06 886 A1    9/1990

OTHER PUBLICATIONS

International Search Report for corresponding PCT/GB2010/051505 completed Nov. 23, 2010 by Bernard Baillet of the EPO.

\* cited by examiner

*Primary Examiner* — Calvin Lee
*Assistant Examiner* — Monica D Harrison

(57) ABSTRACT

This invention generally relates to lateral insulated gate bipolar transistors (LIGBTs), for example in integrated circuits, methods of increasing switching speed of an LIGBT, a method of suppressing parasitic thyristor latch-up in a bulk silicon LIGBT, and methods of fabricating an LIGBT. In particular, a method of suppressing parasitic thyristor latch-up in a bulk silicon LIGBT comprises selecting a current gain $\alpha v$ for a vertical transistor of a parasitic thyristor of the LIGBT such that in at least one predetermined mode of operation of the LIGBT $\alpha v < 1 - \alpha p$ where $\alpha p$ is a current gain of a parasitic bipolar transistor having a base-emitter junction formed by a Schottky contact between the a semiconductor surface and a metal enriched epoxy die attach.

28 Claims, 30 Drawing Sheets

FIG. 1 STATE OF THE ART LIGBT

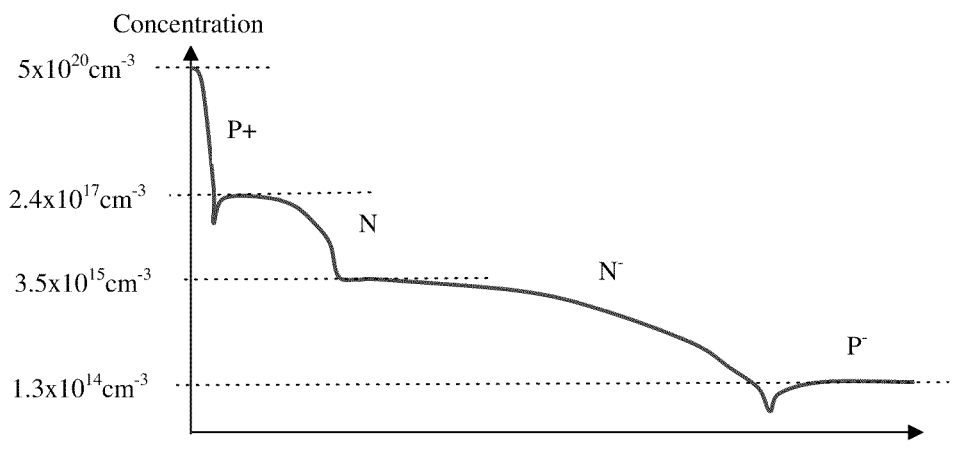
a) State of the art LIGBT
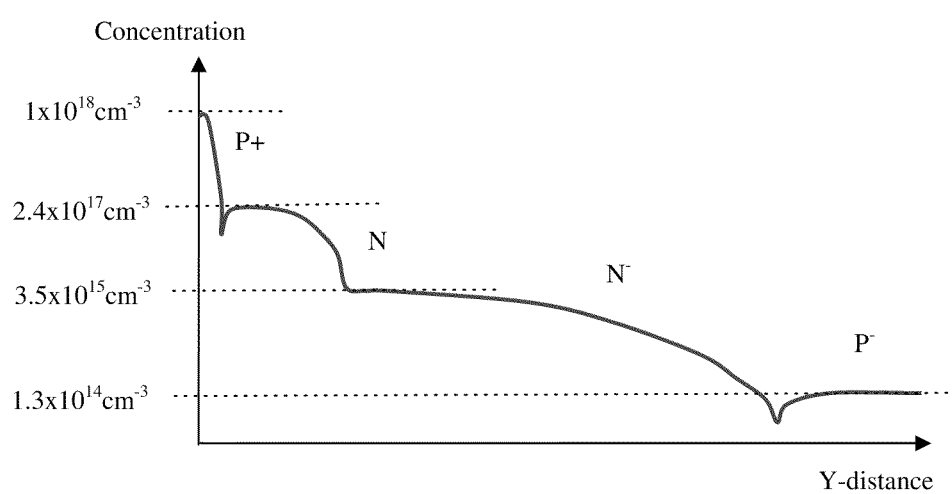
b) P-type anode injector according to this invention
(doping $1\times10^{18}cm^{-3}$)
FIG. 5

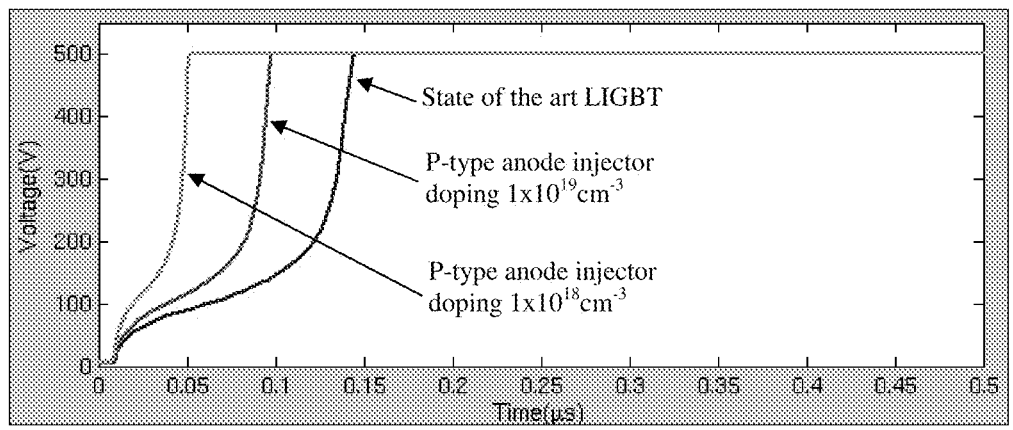
a) Voltage
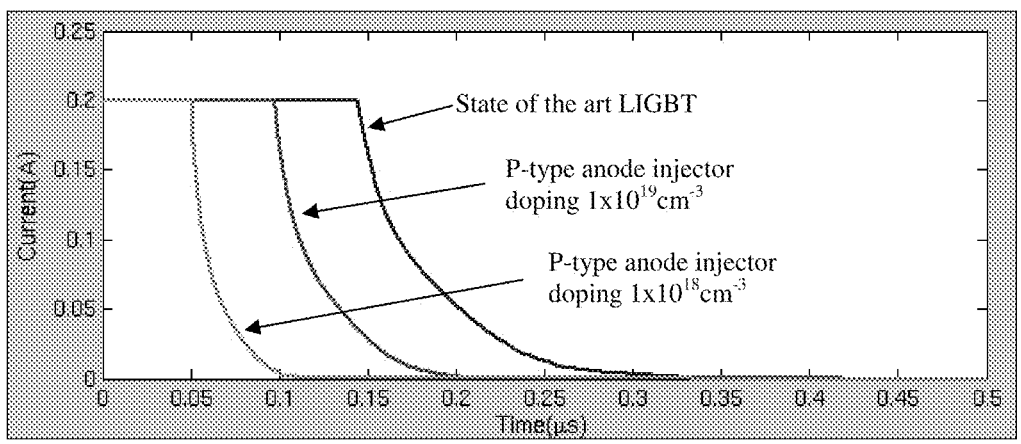
b) Current
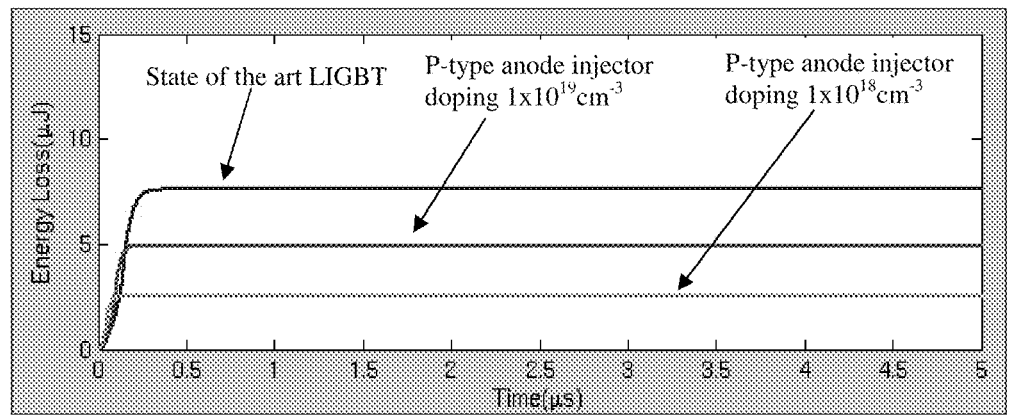
c) Energy loss
FIG. 8

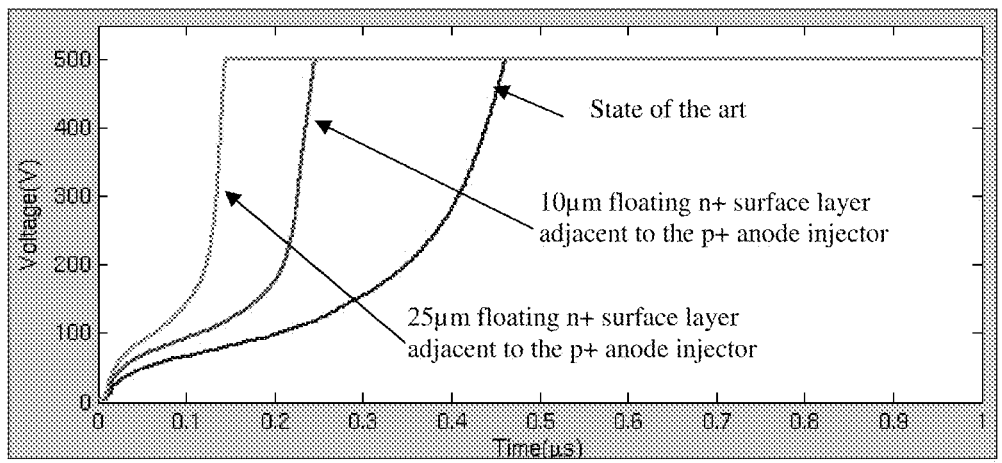
d) Voltage
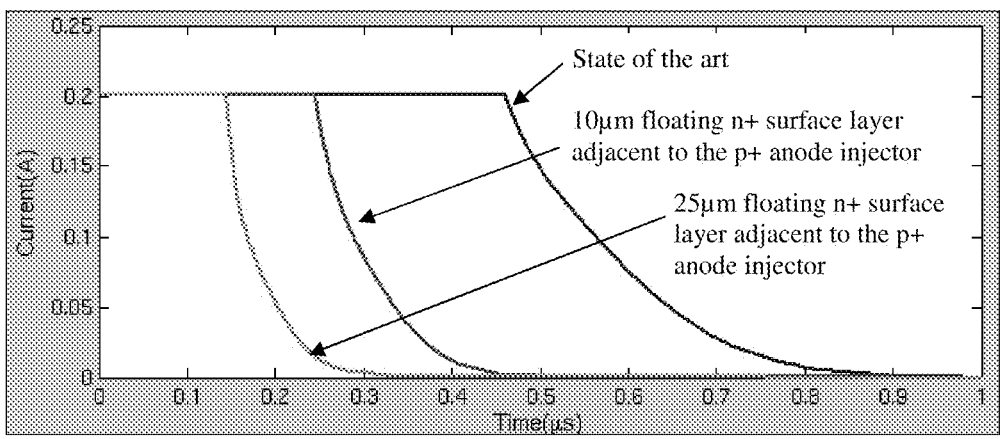
e) Current
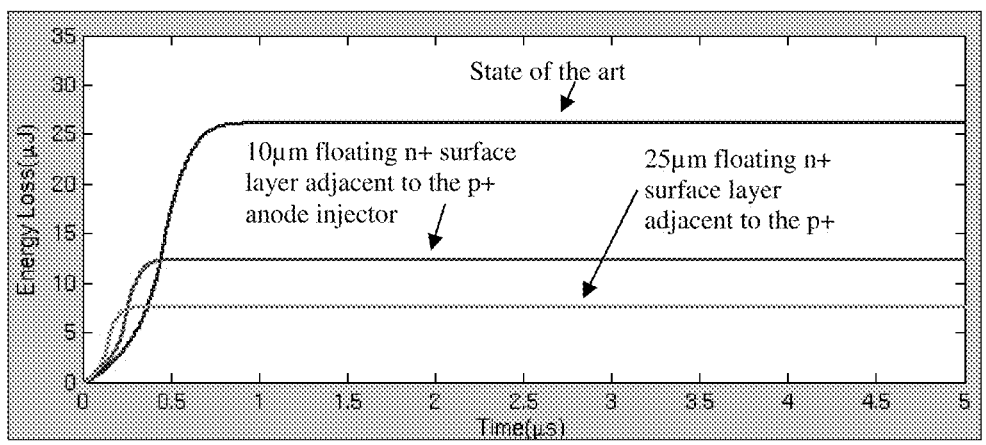
f) Energy loss
FIG. 15

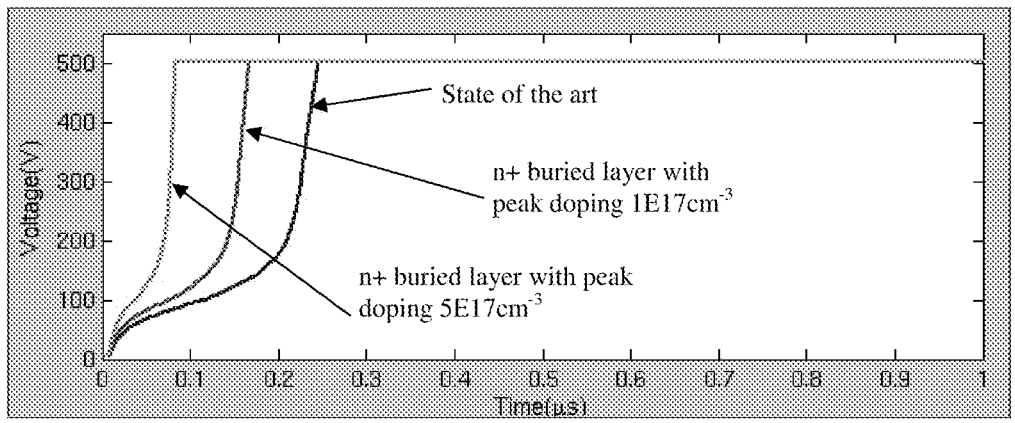
g) Voltage
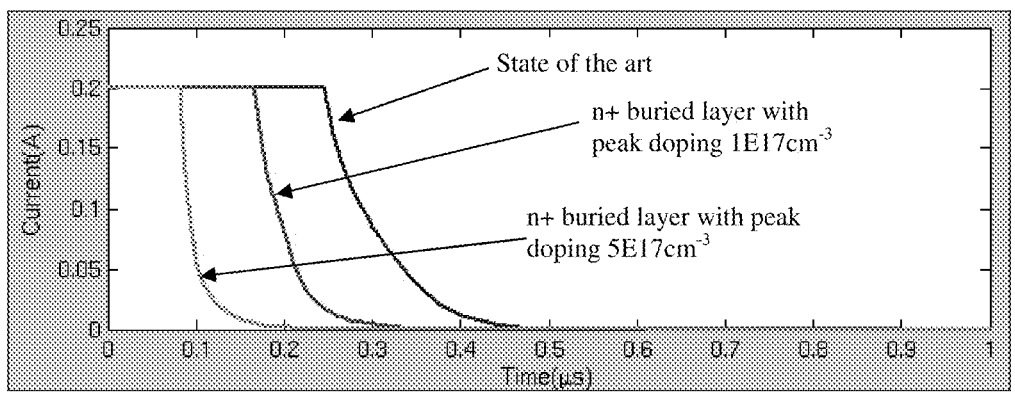
h) Current
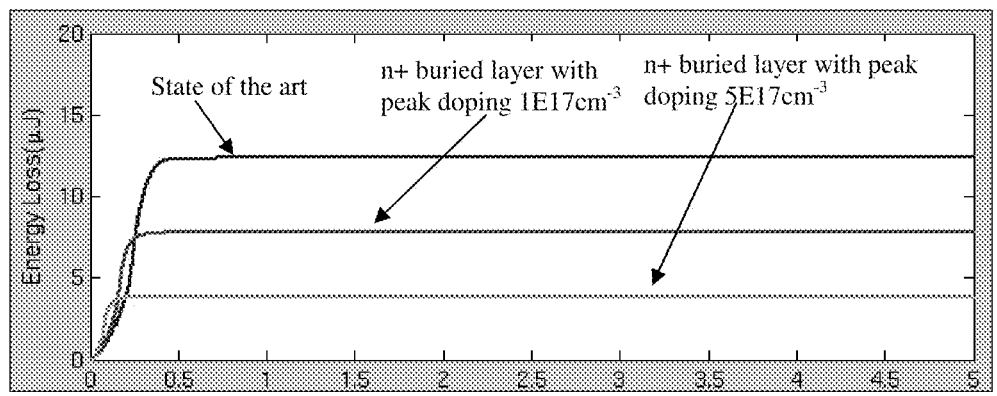
i) Energy loss
FIG. 23

LATERAL INSULATED GATE BIPOLAR TRANSISTORS (LIGBTS)

RELATED APPLICATIONS

The present invention claims priority from U.S. Provisional Patent Application No. 61/240,780, filed 9 Sep. 2009.

FIELD OF THE INVENTION

The invention generally relates to lateral insulated gate bipolar transistors (LIGBTs), for example in integrated circuits, methods of increasing switching speed of an LIGBT, a method of suppressing parasitic thyristor latch-up in a bulk silicon LIGBT, and methods of fabricating an LIGBT.

BACKGROUND TO THE INVENTION

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

Lateral devices in integrated circuits have the high voltage/low voltage main terminals (variously called the anode/cathode, drain/source and emitter/collector) and the control terminal (termed the gate or base) placed at the top surface of the device in order to be easily accessible. In power ICs, such devices are often monolithically integrated with CMOS-type or BiCMOS-type low voltage and/or low power circuits and therefore it is desirable that the lateral high voltage devices are CMOS compatible. It is also possible that several high voltage, power devices are integrated within the same chip.

(It will be appreciated that terms such as "top" and "bottom", "above" and "below", "lateral" and "vertical", and "under" and "over", "underlying", etc. may be used in this specification by convention and that no particular physical orientation of the device as a whole is implied).

MOS bipolar power devices, such as the LIGBT shown in FIG. 1, are based on MOS control with bipolar current conduction in the lowly-doped drift layer or region of the device. Such devices are based on the conductivity modulation concept. At high levels of charge injection, when the current in the device increases, a mobile charge of electrons and of holes is built up in the drift layer, leading to a desirably sharp increase in the conductivity of the drift layer. The mobile charge accumulated, known as plasma, in the on-state dictates the on-state/switching performance of the device given that the plasma must be removed in order to switch the device to the off-state.

The field of LIGBTs therefore continues to provide a need for an LIGBT having improved characteristics, for example increased switching speed and/or a wider range of operating conditions (e.g., any combination of one or more predetermined range of continuous and/or switching current between main terminals, voltage between main terminals, junction and/or ambient temperature, etc.).

For use in understanding the present invention, the following disclosures are referred to:

U.S. Pat. No. 7,381,606 (corresponding to application U.S. Ser. No. 11/783,966, which is related to application U.S. Ser. No. 11/133,455 (U.S. Pat. No. 7,301,220)), F. Udrea, Cambridge Semiconductor Ltd., published Mar. 20, 2008;

WO-A-02/25700, Udrea, Cambridge Semiconductor Ltd., published 2006-03-02;

U.S. Pat. No. 6,703,684, Udrea, Cambridge Semiconductor Ltd., published Apr. 11, 2002;

US-A-2004-0084752, Udrea, Cambridge Semiconductor Ltd., published May 6, 2004;

US-A-2004-0087065, Udrea, Cambridge Semiconductor Ltd., published May 6, 2004; and Microelectronics Reliability Vol. 39, Issues 6-7, June-July 1999, Pages 863-868, J. A. van der Pol et al.

SUMMARY

According to a first aspect of the present invention, there is provided a LIGBT comprising: a first contact region of a first conductivity type; a second contact region of said first conductivity type; a source region of a second, opposite conductivity type located within a well region of said first conductivity type and connected electrically to said second contact region; a lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region, wherein said first contact region is a charge injection region to inject charge towards said lateral drift region and has a peak doping concentration lower than about $1 \times 10^{19}/\text{cm}^3$.

In common with embodiments of all LIGBT aspects of the invention, an LIGBT of this first aspect may broadly be viewed as comprising a MOS component driving a bipolar transistor. For example, an n-channel LIGBT may have an n-channel MOSFET driving the base of a lateral pnp transistor.

The peak doping concentration (i.e., dopant concentration) lower than about $1 \times 10^{19}/\text{cm}^3$ (or, more preferably, lower than about $1 \times 10^{18}/\text{cm}^3$) as defined above may be advantageous for reducing the gain of a lateral pnp transistor (e.g. as shown in FIG. 2) and/or of a vertical pnp transistor (e.g. a first vertical pnp transistor as shown in FIG. 2 with the collector connected to the source/cathode, or as shown outside the thyristor in FIG. 33) of the LIGBT to increase switching speed by reducing plasma build-up as described herein. Alternatively or additionally this arrangement may lead to a reduction in the current gain of the second vertical pnp transistor shown for example in FIGS. 28-33, and therefore may minimise the effect of the break-over (i.e. the activation) and/or the latch-up of the parasitic thyristor as described for example in relation to the eighth to thirteenth aspects. Preferably, the above peak doping concentration of the first contact region is greater than about $5 \times 10^{17}/\text{cm}^3$ and/or is lower than a dopant concentration of the second contact region.

(Increasing the switching speed preferably reflects a reduction in the time for substantially turning off conduction of cathode/source-anode/drain current in the device, i.e., of lateral current through the drift region, after the device has been fully on. Further in this regard, switching voltage and switching current of the device may be voltage and current, respectively, existing between the cathode/source and anode/drain when the device is pulsed on, generally under control of the gate voltage).

The following paragraphs describe optional features, one or more of which may be present in any combination in an LIGBT of the first aspect, or in an LIGBT of or formed by any one of the second to thirteenth aspects described below.

The first contact region (charge injection region) may be connected, preferably ohmically, to a first main terminal, and/or may be located within a buffer region of said second conductivity type (the drift region then being located between the well region and the buffer region). The second contact region (which may be referred to as a charge collection region) may be similarly connected to a second main terminal. "Contact region" throughout this specification is generally a region at a surface of the LIGBT for electrical connection, preferably ohmic, to a terminal having, e.g., a line, wire, bonding pad, etc., and is generally for charge collection from or charge injection into the LIGBT, e.g., may be a charge collection semiconductor region or a charge injection semiconductor region.

The second main terminal may further be connected to the source region, which may act as the source of the MOS component of the LIGBT. The source region may for example be an n+ region where the LIGBT is an n-channel device. The second contact region (e.g., p or p+ where the LIGBT is an n-channel device) may be short relative to the source region.

The lateral drift region may be above or in an upper portion of the lowly doped substrate (the latter being particularly relevant where the device is monolithic within a substrate, e.g., a bulk silicon device), and may have vertical thickness greater than about 1 um and preferably in the range of about 3 um to about 20 um. Preferably, the lateral drift region can be depleted of mobile carriers at or near a breakdown voltage of the drift region during the off-state blocking mode of the LIGBT.

The insulated gate may be attached to a gate terminal to control the resistance or conductivity in the channel region. (As for all instances of "attached" in this specification, the attachment is preferably direct or, less preferably indirect, e.g., via intervening layers and/or regions). The insulated nature of the gate may refer to the presence of an electrically insulating layer between a gate terminal and the channel region. The control of charge may be charge density control in the channel region. Thus, the gate allows switching of the device, e.g., substantially turning on and off of conduction between the cathode/source and anode/drain of the device.

Preferably, the LIGBT is a bulk device, e.g., bulk silicon device. This may for example be advantageous for providing other devices, which may operate at different voltages compared to the LIGBT, e.g., CMOS circuitry, on the same IC as the LIGBT. Thus, the LIGBT may comprise a semiconductor wafer substrate of said first conductivity type, said semiconductor wafer substrate comprising said lateral drift region, wherein said substrate extends under substantially the entire lateral extent of the LIGBT. (The first and second conductivity types being opposite, e.g., n-type and p-type or vice versa, respectively). Alternatively, the LIGBT may comprise a silicon-on-insulator (SOI) substrate, for example as shown in FIG. 10, and/or the LIGBT may comprise a layer comprising said drift region (this layer may be the drift region), a semiconductor substrate region of said first conductivity type below said layer, wherein at least a portion of said drift region is not located directly over said semiconductor substrate, for example as shown in FIG. 11 that shows membrane technology. This may be achieved by etching a semiconductor (e.g. silicon) substrate in a controlled manner to provide an exposed surface of at least part of the drift region, or etching to a buried, e.g., oxide, layer that is more etch-resistant than the semiconductor substrate. For example, the buried oxide of an SOI substrate may be used as an etch stop.

There may further be provided the LIGBT, wherein the junction efficiency of the junction formed between said charge injection region and the lateral drift region, or more preferably the buffer region if present, is below about 1, more preferably in the range of about 0.5 to about 0.9.

There may further be provided an integrated circuit (IC) comprising a LIGBT according to the first aspect, further comprising at least a MOSFET, wherein said charge injection region has substantially the same doping concentration as the source or drain of said MOSFET, the MOSFET preferably being a CMOS-based MOSFET.

According to a second aspect of the present invention, there is provided a method of increasing switching speed of an LIGBT, the LIGBT comprising: a first contact region of a first conductivity type; a second contact region of said first conductivity type; a source region of a second, opposite conductivity type located within a well region of said first conductivity type and connected electrically to said second contact region; a lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region, wherein the first contact region is a charge injection region to inject charge towards said lateral drift region, the method comprising: selecting a peak doping concentration of said first contact region lower than about $1 \times 10^{19}/cm^3$ and/or lower than a dopant concentration of said second contact region.

As for the first aspect, the above peak doping concentration lower than about $1 \times 10^{19}/cm^3$ may be advantageous for reducing the gain of a lateral and/or vertical pnp transistor of the LIGBT to increase switching speed, and may suppress parasitic thyristor latch-up. Any one or more optional features as described above for the first aspect may be formed in this corresponding method aspect in any combination, e.g., forming the first contact region within a buffer region and forming the drift region between the buffer region and well region.

According to a third aspect of the present invention, there is provided a LIGBT comprising: a first contact region of a first conductivity type; a second contact region of said first conductivity type; a source region of said second, opposite conductivity type located within a well region of said first conductivity type and connected electrically to said second contact region; a lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region, wherein said first contact region is a charge injection region to inject charge towards said lateral drift region and has a dopant concentration lower than a dopant concentration of said second contact region.

Similarly as for the first aspect, the above lower peak dopant concentration, e.g., lower than about $1 \times 10^{19}/\text{cm}^3$, may be advantageous for reducing the gain of a lateral and/or vertical pnp transistor of the LIGBT to increase switching speed, and/or may suppress parasitic thyristor latch-up. Any one or more optional features as described above for the first aspect may be formed in this aspect in any combination, e.g., forming the first contact region within a buffer region and forming the drift region between the buffer region and well region.

There may further be provided an integrated circuit (IC) comprising a LIGBT according to the third aspect, preferably further comprising a MOSFET such as a CMOS MOSFET. According to a fourth aspect of the present invention, there is provided a LIGBT comprising: a first contact region of a first conductivity type located within a neighbouring region of second conductivity type; a second contact region of a first conductivity type; a source region of a second, opposite conductivity type located within a well region of first conductivity type and connected electrically to said second contact region; a lateral drift region of the second conductivity type placed between the said well region and said first contact region, said lateral drift region to be depleted of mobile carriers at breakdown voltage during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region; and a floating semiconductor region of said second conductivity type located laterally adjacent said first contact region and having a higher doping concentration than said neighbouring region of said second conductivity type, wherein said first contact region is a charge injection region and said floating semiconductor region extends substantially continuously along substantially a complete length of said charge injection contact region in a lateral direction. Preferably, the neighbouring region is a buffer region (e.g., n or n-well) within which at least the first contact region, and preferably the floating region, is formed), or is the drift region. More specifically, the first contact region may be formed within a buffer region of the second conductivity type, the drift region then being between the buffer region and well region, the floating semiconductor region having a higher doping concentration than said buffer region.

The floating semiconductor region, which may be at a surface of the LIGBT, may be advantageous for reducing the gain of a lateral and/or vertical pnp transistor (e.g. a lateral transistor such as shown in FIG. 2 and/or first vertical pnp transistor as shown in FIG. 2 with the collector connected to the source/cathode or as shown outside the thyristor in FIG. 33) of the LIGBT to increase switching speed by reducing plasma build-up as described herein. More specifically, charge injection from the charge injection region may be reduced due to the presence of the floating region due to decrease in injection efficiency and/or Auger recombination, and this may reduce the gain of the above pnp transistors. Alternatively or additionally this arrangement may lead to a reduction in the current gain of the second vertical pnp transistor shown for example in FIGS. 28-33, to minimise the effect of the break-over (i.e. the activation) and/or the latch-up of the parasitic thyristor as described for example in relation to the eighth to thirteenth aspects.

The floating semiconductor region, which may be formed during the same process step as said source region, may contact the charge injection semiconductor region. Preferably, the floating semiconductor region has a doping concentration in a range of about $1 \times 10^{19}/\text{cm}^3$ to about $1 \times 10^{21}/\text{cm}^3$. The substantial continuous extension preferably means that there is no interruption along the lateral doped profile of the floating region, e.g., the floating region does not comprise a plurality of separate islands. For example, the floating region may comprise a single elongate, e.g., rectangular lateral-cross-sectional shape. Where the LIGBT is a circular device having an arc- or ring-shaped charge injection contact region, the shape of the floating region may have a corresponding ring- or arc-shape inside the radius of, and preferably directly adjacent, the charge injection contact region.

As for all other LIGBT aspects, the LIGBT may further comprise a field oxide region over the lateral drift region between said first and second contact regions, wherein said floating semiconductor region extends to said field oxide region.

As for the LIGBT of or formed by, in particular, the first to third aspects, the LIGBT may have two surfaces, the first surface being attached to a first main terminal, a second main terminal and a gate terminal, the second surface preferably being a surface of a lowly doped semiconductor substrate region of a first conductivity type. (However, the latter may not always be the case, for example in some SOI and/or membrane technology embodiments described in this specification).

More generally, and similarly as described above, the LIGBT may comprise a semiconductor wafer substrate of the first conductivity type, the semiconductor wafer substrate comprising said lateral drift region, wherein said substrate extends under substantially the entire lateral extent of the LIGBT. Thus, the LIGBT may be a bulk silicon device. Alternatively, the LIGBT may comprise a silicon-on-insulator (SOI) substrate, for example as shown in FIG. 17, and/or the LIGBT may comprise a layer comprising said drift region, the LIGBT comprising a semiconductor substrate region of said first conductivity type below said layer, at least a portion of said drift region not located directly over said semiconductor substrate, for example as shown in FIG. 18 and/or as described in relation to use of membrane technology in the first aspect above.

There may further be provided an integrated circuit (IC) comprising a LIGBT according to the fourth aspect, preferably further comprising a MOSFET such as a CMOS MOSFET.

According to a fifth aspect of the present invention, there is provided a method of increasing switching speed of an LIGBT, the LIGBT comprising: a first contact region of a first conductivity type located within a neighbouring region of second conductivity type, said first contact region to form a charge injection contact region to inject charge towards a lateral drift region; a second contact region of said first conductivity type; a source region of said second, opposite conductivity type located within a well region of said first conductivity type and connected electrically to said second contact region; said lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and an insulated gate above and in direct contact to said well region, said insulated gate to control charge in a channel region between said lateral drift region and said source region of said second conductivity type and to thereby control flow of charge within the said drift region, said method comprising: forming a floating semiconductor region of said second conductivity type located laterally adjacent said charge injection contact region and having a higher doping concentration than said neighbouring region of said second conductivity type, said floating semiconductor region (which may be at a surface of the LIGBT) extending substantially continuously along substantially a complete length of said charge injection contact region in a lateral direction. In this method, said forming said floating semiconductor region may be at the same time as said forming said source region. The LIGBT may be for example as defined by the fourth aspect above including any combination of the optional features thereof, e.g., where the neighbouring region is a buffer region and the drift region is between the well region and buffer region; alternatively the neighbouring region may be the drift region.

Regarding formation of the various regions of the fifth aspect as defined above, at least the first contact region may be formed by doping to a predetermined dopant concentration. (This further applies to all of the LIGBTs of or formed by aspects of the invention).

According to a sixth aspect of the present invention, there is provided a LIGBT comprising: a first contact region of a first conductivity type as a charge injection semiconductor region; a second contact region of a first conductivity type; a source region of a second, opposite conductivity type located within a well region of first conductivity type and connected electrically to said second contact region; a lateral drift region of the second conductivity type placed between the said well region and said first contact region, said lateral drift region to be depleted of mobile carriers during an off-state blocking mode of the LIGBT and able to conduct charge during on-state conducting mode of the LIGBT; and an insulated gate placed above and in direct contact to said well region, said insulated gate to control the charge in a channel region between said lateral drift region and said source region of said second conductivity type and to thereby control flow of charge within the said drift region; and the LIGBT further comprising: a buried floating semiconductor region below said charge injection semiconductor region and adjacent said lateral drift region, the buried floating semiconductor region being of the second conductivity type and more highly doped than said lateral drift region.

Similarly as for the first aspect, the first contact region may be located within a buffer region of the second conductivity type, in which case the drift region may be between the well region and buffer region.

The buried floating semiconductor region may be advantageous for reducing the gain of a lateral and/or vertical pnp transistor (e.g. a lateral or first vertical pnp transistor as shown in FIG. 2 with the collector connected to the source/cathode or that outside the thyristor as shown in FIG. 33) of the LIGBT to increase switching speed by reducing plasma build-up as described herein. Alternatively or additionally this arrangement may lead to a reduction in the current gain of the second vertical pnp transistor shown for example in FIGS. 28-33, and therefore may minimise the effect of the break-over (i.e. the activation) and/or the latch-up of the parasitic thyristor as described for example in relation to the eighth to thirteenth aspects.

The buried floating semiconductor region may contact the charge injection semiconductor region. Preferably, the charge injection contact region is within a said buffer region that is above and contacts said buried floating semiconductor region. The buried floating semiconductor region may have a peak doping concentration in a range of about $1\times10^{18}/cm^3$ to about $1\times10^{20}/cm^3$.

As for the LIGBT of or formed by the first to fifth aspects in particular, the LIGBT may have two surfaces, the first surface being attached to a first main terminal, a second main terminal and a gate terminal, the second surface preferably being a surface of a lowly doped semiconductor substrate region of a first conductivity type. (However, the latter may not always be the case, for example in some SOI and/or membrane technology embodiments described in this specification).

More generally, and similarly as described above, the LIGBT may comprise a semiconductor wafer substrate of the first conductivity type, said semiconductor wafer substrate comprising said lateral drift region, wherein said substrate extends under substantially the entire lateral extent of the LIGBT. Thus, the LIGBT may be a bulk silicon device. Alternatively, the LIGBT may comprise a silicon-on-insulator (SOI) substrate, for example as shown in FIG. 24, and/or the LIGBT may comprise a layer comprising said drift region, the LIGBT comprising a semiconductor substrate region of said first conductivity type below said layer, at least a portion of said drift region not located directly over said semiconductor substrate, for example as shown in FIG. 25 and/or as described for the use of membrane technology in the first aspect above.

There may further be provided an integrated circuit comprising an LIGBT according to the sixth aspect.

According to a seventh aspect of the present invention, there is provided a method of increasing switching speed of an LIGBT, the LIGBT comprising: a first contact region of a first conductivity type as a charge injection semiconductor region; a second contact region of a first conductivity type; a source region of a second, opposite conductivity type located within a well region of first conductivity type and connected electrically to said second contact region; a lateral drift region of the second conductivity type placed between the said well region and said first contact region, said lateral drift region to be depleted of mobile carriers during an off-state blocking mode of the LIGBT and able to conduct charge during on-state conducting mode of the LIGBT; and an insulated gate placed above and in direct contact to said well region, said insulated gate to control the charge in a channel region between said lateral drift region and said source region of said second conductivity type and to thereby control flow of charge within the said drift region, the method comprising: forming a buried floating semiconductor region below said charge injection semiconductor region and adjacent said lateral drift region, the buried floating semiconductor region being of the second conductivity type and more highly doped than said lateral drift region.

The seventh aspect is thus a method corresponding to the sixth aspect and may have corresponding optional features of the sixth aspect.

Generally, the eighth to thirteenth aspects below relate to suppression of a parasitic thyristor in an LIGBT. In this regard, it is noted that any combination of one or more of the above LIGBT aspects, or of one or more of the above method aspects, may be used to achieve such suppression.

According to a eighth aspect of the present invention, there is provided a method of suppressing parasitic thyristor latch-up in a bulk silicon LIGBT, said LIGBT comprising: two semiconductor surfaces, a first said semiconductor surface being attached to a first main terminal, a second main terminal and a gate terminal, a second said semiconductor surface being a surface of a doped substrate of said LIGBT and attached to a back terminal made of a metal enriched epoxy die attach, the doped substrate having a peak dopant concentration of less than about $1\times10^{17}/cm^3$ (more preferably less than about $1\times10^{16}/cm^3$); a parasitic thyristor having a first thyristor terminal comprising said first main terminal and a second thyristor terminal comprising said back terminal; said parasitic thyristor being formed of two bipolar transistors with opposed conductivity types connected in a thyristor configuration, one of said two bipolar transistors being a vertical bipolar transistor with an emitter region attached to the said first main terminal and another of said two bipolar transistors being a parasitic bipolar transistor, said parasitic bipolar transistor having a base-emitter junction formed by a Schottky contact between the said second semiconductor surface and the metal enriched epoxy die attach directly adjacent to said substrate, the method comprising: selecting a current gain $\alpha v$ for said vertical transistor of said LIGBT such that in at least one predetermined mode of operation of the LIGBT: $\alpha v < 1 - \alpha p$ where $\alpha p$ is a current gain of said parasitic bipolar transistor. The at least one predetermined mode is preferably all modes of operation required by the LIGBT's intended application.

The bulk silicon LIGBT may be an LIGBT of or formed by any one of the first to seventh aspects.

The following paragraphs describe optional features of the eighth aspect and further apply to the ninth to thirteenth aspects.

In an embodiment, both of the two bipolar transistors may be described as parasitic and vertical; however, for clarity, as in the above definition of the eighth aspect, one is identified as the parasitic transistor in contrast to the other which is identified as the vertical transistor.

Compliance with $\alpha v < 1 - \alpha p$ in at least one mode may mean that occurrence of the said latch-up of the parasitic thyristor having the first thyristor terminal is reduced across that and/or all operating modes, and more preferably that the said latch-up is substantially inhibited across such mode(s).

An LIGBT of or formed by any of the aspects of the invention may be a high power device, for example having at least one operating mode (e.g., the predetermined mode above) with a continuous or switching current in the range 10 mA to 50 A and typically higher than 0.1 A and smaller than 5 A. In any operating mode(s), such a high power device may be capable of delivering from a few (e.g., 1-10) mWatts to 1 Watt or even a few tens of Watts (e.g., 10-50 W or up to 90 W) of power.

The 'all modes' of operation may comprise all modes of operation of the LIGBT required by its intended application, which may comprise one or more operating mode(s) each of which may cover a predetermined range of operating conditions defined by, e.g. any one or more predetermined values or ranges of: ambient temperature, junction temperature (e.g. −55 Celcius to 125 Celcius for some CMOS devices, greater for automotive devices, etc), on-state continuous drift region current (e.g. 10 mA to 50 A), on-state switching (e.g., pulsed) current, switching (e.g., pulsed) voltage and/or continuous forward and/or reverse voltage levels (e.g., between the anode and cathode terminals; e.g. 20 Volts to 1200 V, or higher). Thus, the at least one predetermined mode may be one such mode defining a range or specific value(s) of condition(s). For example, such a mode (which may be the only mode of 'all modes') may be defined by a 20 deg C. ambient temperature and/or, 0.1 A, 0.2 A or 0.5 A of switching or continuous on-state drift region current, which may be a maximum operating current of the LIGBT.

The Schottky contact may be at an interface between the surface and the die attach, the interface forming a Schottky barrier. The die attach may comprise droplet(s) or other amount of thermo-setting silver epoxy for bonding, electrical and/or thermal connection of a wafer substrate surface of the LIGBT to a chip carrier such as a leadframe.

The vertical bipolar transistor with an emitter region attached to the said first main terminal may have emitter, base and collector regions comprising a charge injection contact of said LIGBT as the emitter region, a drift region or a buffer layer with the same conductivity type as the drift region as the base region, and said doped substrate as the collector region. (The first and second main terminals may be for charge collection and charge injection (or vice versa), respectively).

According to a ninth aspect of the present invention, there is provided a method of fabricating a bulk silicon LIGBT according to the first aspect having inhibited thyristor latch-up using a method of suppressing parasitic thyristor latch-up in an LIGBT, said bulk silicon LIGBT comprising: two semiconductor surfaces, a first said semiconductor surface being attached to a first main terminal, a second main terminal and a gate terminal, a second said semiconductor surface being a surface of a doped substrate of said LIGBT and attached to a back terminal made of a metal enriched epoxy die attach, the doped substrate having a peak dopant concentration of less than about $1 \times 10^{17}/cm^3$ (more preferably less than about $1 \times 10^{16}/cm^3$); a parasitic thyristor having a first thyristor terminal comprising said first main terminal and a second thyristor terminal comprising said back terminal; and said parasitic thyristor being formed of two bipolar transistors with opposed conductivity types connected in a thyristor configuration, one of said two bipolar transistors being a vertical bipolar transistor with an emitter region attached to the said first main terminal and another of said two bipolar transistors being a parasitic bipolar transistor, said parasitic bipolar transistor having a base-emitter junction formed by a Schottky contact between the said second semiconductor surface and the metal enriched epoxy die attach directly adjacent to said substrate, the method of suppressing comprising: selecting a current gain $\alpha v$ for said vertical transistor of said bulk silicon LIGBT such that in at least one predetermined mode of operation of the bulk silicon LIGBT: $\alpha v < 1 - \alpha p$ where $\alpha p$ is a current gain of said parasitic bipolar transistor, the method of fabricating comprising: fabricating a said bulk silicon LIGBT with a said vertical bipolar transistor having said selected current gain, wherein said emitter region of said vertical bipolar transistor comprises said charge injection region having said peak doping concentration lower than about $1 \times 10^{19}/cm^3$. The at least one predetermined mode is preferably all modes of operation. ('All modes' and the predetermined mode may be as defined in relation to the eighth aspect above).

The selected current gain may be achieved at least partly by determination and realisation of a specific value of the said peak doping concentration lower than about $1 \times 10^{19}/cm^3$.

The above method may further be applied to fabricate the LIGBT of the first aspect in an IC as described above. There may further be provided an LIGBT fabricated according to the method of the ninth aspect.

According to a tenth aspect of the present invention, there is provided a method of fabricating a bulk silicon LIGBT according to the third aspect having inhibited thyristor latch-up using a method of suppressing parasitic thyristor latch-up in a LIGBT, said bulk silicon LIGBT comprising: two semiconductor surfaces, a first said semiconductor surface being attached to a first main terminal, a second main terminal and a gate terminal, a second said semiconductor surface being a surface of a doped substrate of said LIGBT and attached to a back terminal made of a metal enriched epoxy die attach, the doped substrate having a peak dopant concentration of less than about $1 \times 10^{17}/cm^3$ (more preferably less than about $1 \times 10^{16}/cm^3$); a parasitic thyristor having a first thyristor terminal comprising said first main terminal and a second thyristor terminal comprising said back terminal; and said parasitic thyristor being formed of two bipolar transistors with opposed conductivity types connected in a thyristor configuration, one of said two bipolar transistors being a vertical bipolar transistor with an emitter region attached to the said first main terminal and another of said two bipolar transistors being a parasitic bipolar transistor, said parasitic bipolar transistor having a base-emitter junction formed by a Schottky contact between the said second semiconductor surface and the metal enriched epoxy die attach directly adjacent to said substrate, the method of suppressing comprising: selecting a current gain $\alpha v$ for said vertical transistor of said bulk silicon LIGBT such that in at least one predetermined mode of operation of the bulk silicon LIGBT: $\alpha v<1-\alpha p$ where $\alpha p$ is a current gain of said parasitic bipolar transistor, the method of fabricating comprising: fabricating a said bulk silicon LIGBT with a said vertical bipolar transistor having said selected current gain, wherein said emitter region of said vertical bipolar transistor comprises said charge injection region having said peak doping concentration lower than said dopant concentration of said second contact region. The at least one predetermined mode is preferably all modes of operation. ('All modes' and the predetermined mode may be as defined in relation to the eighth aspect above).

The selected current gain may be achieved at least partly by determination and realisation of a specific value of the said lower doping concentration.

There may further be provided an LIGBT fabricated according to the method of the tenth aspect.

According to a eleventh aspect of the present invention, there is provided a method of fabricating a bulk silicon LIGBT according to the fourth aspect having inhibited thyristor latch-up using a method of suppressing parasitic thyristor latch-up in a LIGBT, said bulk silicon LIGBT comprising: two semiconductor surfaces, a first said semiconductor surface being attached to a first main terminal, a second main terminal and a gate terminal, a second said semiconductor surface being a surface of a doped substrate of said LIGBT and attached to a back terminal made of a metal enriched epoxy die attach, the doped substrate having a peak dopant concentration of less than about $1\times10^{17}/cm^3$ (more preferably less than about $1\times10^{16}/cm^3$); a parasitic thyristor having a first thyristor terminal comprising said first main terminal and a second thyristor terminal comprising said back terminal; and said parasitic thyristor being formed of two bipolar transistors with opposed conductivity types connected in a thyristor configuration, one of said two bipolar transistors being a vertical bipolar transistor with an emitter region attached to the said first main terminal and another of said two bipolar transistors being a parasitic bipolar transistor, said parasitic bipolar transistor having a base-emitter junction formed by a Schottky contact between the said second semiconductor surface and the metal enriched epoxy die attach directly adjacent to said substrate, the method of suppressing comprising: selecting a current gain $\alpha v$ for said vertical transistor of said bulk silicon LIGBT such that in at least one predetermined mode of operation of the bulk silicon LIGBT: $\alpha v<1-\alpha p$ where $\alpha p$ is a current gain of said parasitic bipolar transistor, the method of fabricating comprising: fabricating a said bulk silicon LIGBT with a said vertical bipolar transistor having said selected current gain, wherein said emitter region of said vertical bipolar transistor comprises said charge injection region having said floating semiconductor region extending substantially continuously along said substantially a complete length of said charge injection contact region in said lateral direction. The at least one predetermined mode is preferably all modes of operation.

The selected current gain may be achieved at least partly by providing the floating semiconductor region.

There may further be provided an LIGBT fabricated according to the method of the eleventh aspect. The above method may further be applied to fabricate an LIGBT of the fourth aspect in an IC as described above.

According to a twelfth aspect of the present invention, there is provided a method of fabricating a bulk silicon LIGBT according to the sixth aspect having inhibited thyristor latch-up using a method of suppressing parasitic thyristor latch-up in a LIGBT, said bulk silicon LIGBT comprising: two semiconductor surfaces, a first said semiconductor surface being attached to a first main terminal, a second main terminal and a gate terminal, a second said semiconductor surface being a surface of a doped substrate of said LIGBT and attached to a back terminal made of a metal enriched epoxy die attach, the doped substrate having a peak dopant concentration of less than about $1\times10^{17}/cm^3$ (more preferably less than about $1\times10^{16}/cm^3$); a parasitic thyristor having a first thyristor terminal comprising said first main terminal and a second thyristor terminal comprising said back terminal; and said parasitic thyristor being formed of two bipolar transistors with opposed conductivity types connected in a thyristor configuration, one of said two bipolar transistors being a vertical bipolar transistor with an emitter region attached to the said first main terminal and another of said two bipolar transistors being a parasitic bipolar transistor, said parasitic bipolar transistor having a base-emitter junction formed by a Schottky contact between the said second semiconductor surface and the metal enriched epoxy die attach directly adjacent to said substrate, the method of suppressing comprising: selecting a current gain $\alpha v$ for said vertical transistor of said bulk silicon LIGBT such that in at least one predetermined mode of operation of the bulk silicon LIGBT: $\alpha v<1-\alpha p$ where $\alpha p$ is a current gain of said parasitic bipolar transistor, the method of fabricating comprising: fabricating a said bulk silicon LIGBT with a said vertical bipolar transistor having said selected current gain, wherein said emitter region of said vertical bipolar transistor comprises said charge injection region having said buried floating semiconductor region below said charge injection semiconductor region and adjacent said lateral drift region. The at least one predetermined mode is preferably all modes of operation. ('All modes' and the predetermined mode may be as defined in relation to the eighth aspect above).

The selected current gain may be achieved at least partly by providing the buried floating semiconductor region.

There may further be provided an LIGBT fabricated according to the method of the twelfth aspect. The above method may further be applied to fabricate an LIGBT of the sixth aspect in an IC as described above.

According to a thirteenth aspect of the present invention, there is provided a LIGBT fabricated in bulk silicon and having two surfaces, a first said surface being attached to a first main terminal, a second main terminal and a gate terminal, a second said surface being attached to a back terminal made of a metal enriched epoxy die attach; said LIGBT further comprising: a doped substrate of a first conductivity type, extending from the said second surface and having a peak dopant concentration of less than about $1\times10^{17}/cm^3$ (more preferably less than about $1\times10^{16}/cm^3$); and a drift region of a second, opposite conductivity type over the said doped substrate, the drift region extending to the said first surface, wherein said substrate is electrically coupled at the said second surface to a package of said LIGBT by an underlying metal enriched epoxy die attach, wherein a parasitic bipolar transistor is formed having an emitter-base junction formed by a Schottky contact between said metal enriched epoxy die attach and said doped substrate, wherein a collector of said parasitic transistor is said drift region and said parasitic bipolar transistor has a current gain αp, wherein said LIGBT comprises a further, vertical bipolar transistor having emitter, base and collector regions comprising a charge injection region of the first conductivity type as the emitter region extending from the said first surface and connected to a terminal (e.g., a high voltage terminal), said drift region or a buffer layer of the same conductivity type as that of said drift region as the base region, and said doped substrate region as the collector region, wherein said vertical transistor has a current gain of αv, wherein said vertical bipolar transistor and said parasitic bipolar transistor have opposite conductivity types and are connected, within said LIGBT, in a thyristor configuration, and wherein said current gain of said vertical transistor satisfies αv<1−αp. The electrical coupling to the package may be to a chip carrier such as a leadframe.

Preferably, the vertical transistor satisfies αv<1−αp at the maximum junction temperature and maximum on-state and switching currents and voltages such that a latch-up of said thyristor is suppressed in each and all operating modes.

The above LIGBT in bulk silicon may be as defined or formed by any one of above-described first to twelfth aspects of the present invention. 'Underlying' may mean underlying the substrate when the lateral plane of the LIGBT is horizontal, i.e., such that the first surface is on top and the second surface is underneath, though no orientation of the device as a whole is implied. The Schottky contact may be at an interface between the metal enriched epoxy die attach and said doped substrate.

There may further be provided the LIGBT of the thirteenth aspect, wherein said vertical transistor satisfies αv<1−αp at a temperature of 20° C. and with a current through said drift region of at least 0.1 Amp. Such a temperature may be ambient temperature and/or the current may be continuous. Such current and/or temperature may specify, for example, a maximum or recommended average operating condition of the device.

Preferred embodiments are defined in the appended dependent claims.

BRIEF DESCRIPTION OF THE DRAWINGS

For a better understanding of the invention and to show how the same may be carried into effect, reference will now be made, by way of example, to the accompanying drawings, in which:

FIG. 5 shows schematically the doping profile in cut-line at the anode side of the device for a state-of-the-art LIGBT and the device as shown in FIG. 4 according to the first arrangement of the invention;

FIGS. 6-8 show the I-V on-state characteristics, the hole concentration (plasma concentration) and turn-off characteristics and energy losses for a state-of-the-art LIGBT and the device as shown in FIG. 4 according to the first arrangement of the invention;

FIGS. 13-15 show the I-V on-state characteristics, the hole concentration (plasma concentration) and turn-off characteristics and energy losses for a state-of-the-art LIGBT and the device as shown in FIG. 12 according to the second arrangement of the invention;

FIG. 23 shows schematically the trade-off between energy losses and on-state voltage drop for the device shown in FIG. 19 when the doping of the floating n+ buried layer changes;

DETAILED DESCRIPTION OF PREFERRED EMBODIMENTS

Figure 1:
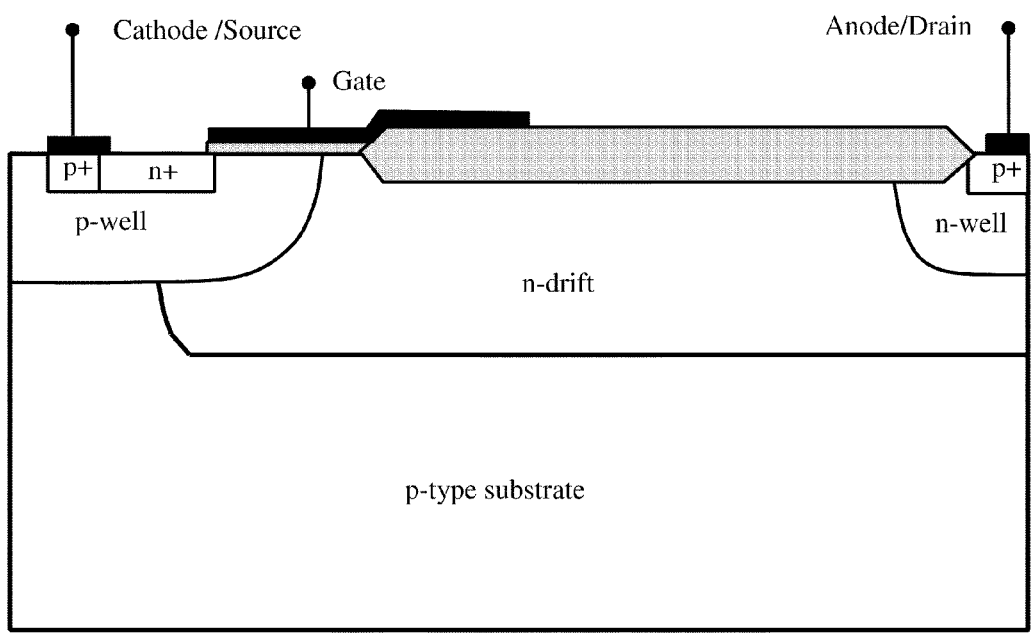
FIG. 1 shows schematically a cross-section view of a state of the art LIGBT in bulk technology.

The following describes arrangements falling within the broader aspects of the present invention summarised above, and more specific embodiments.

Embodiments are particularly concerned with high voltage semiconductor devices which can be used in power integrated circuits and have particular application to MOS-bipolar transistors.

An LIGBT embodiment includes relatively lowly doped, p type, transparent anode injectors and/or floating highly doped n+ layer at the surface or buried, adjacent to the anode region in order to reduce the gain of a pnp transistor (e.g., the vertical pnp transistor of FIG. 2 or first vertical transistor of FIG. 33) and hence increase the turn-off speed of the device. In one arrangement, e.g., the first arrangement, the doping of the p type injector is adjusted to control the injection efficiency of the anode junction and thus to reduce the amount of plasma injected into the device so as to increase the switching speed. The p type anode layer is more lowly doped than a p+ anode layer around $1 \cdot 10^{20}$ cm$^{-3}$ to $5 \cdot 10^{20}$ cm$^{-3}$ but doped enough to make an ohmic contact (i.e. avoid a Schottky contact). The doping range of the p-type injector is between $1 \cdot 10^{17}$ cm$^{-3}$ and $1 \cdot 10^{19}$ cm$^{-3}$. Its depth from the surface is between 0.1 to 1 µm. In a second arrangement a highly doped floating n+ layer is placed at the surface adjacent to the p+ or p type anode injector. The n+ layer serves to increase the Auger recombination and thus reduce the plasma injection in order to increase the turn-off speed. In a third arrangement the floating n+ layer is buried and placed directly below the p+ or p type anode injector. This may serve to kill or reduce the vertical injection of plasma while still allowing lateral injection of plasma. The width, the thickness and the doping of the buried n+ layer may be adjusted to increase the turn-off speed with acceptably good on-state capability. In a fourth arrangement, latch-up of a parasitic thyristor comprising a pnp and an npn bipolar transistor, both of which may be vertical and/or parasitic to the LIGBT, the npn transistor formed by a Schottky barrier on a back surface of the LIGBT, may be suppressed by selecting an appropriate gain of either or both bipolar transistors; this may be achieved in combination with any one of the first to third arrangements.

The LIGBT, for example as in any of the above arrangements, can be broadly regarded (in terms of an equivalent circuit) as a low voltage MOS component driving a wide base (high voltage) bipolar transistor. By way of example, an n-channel LIGBT has an n-channel MOSFET driving the base of a 'lateral' pnp transistor. Depending on the technology, there may be a second pnp transistor which has a narrow base and a wide collector which operates in parallel with the lateral pnp transistor. Since this transistor has a 'more' vertical orientation it is termed here as the vertical pnp transistor. The positions of the two pnp transistors are shown schematically in FIG. 2 (wherein the emitter of the vertical pnp transistor would more preferably be shown as being attached to the p+ anode/drain contact region). The vertical pnp transistor is also driven by the low voltage MOS component, and may for example correspond broadly to the first vertical transistor shown in FIG. 33. The concomitant presence of the two transistors is generally the case of an LIGBT in bulk technology where the drift region is placed within a p-substrate and the p-substrate acts as the collector region of the vertical pnp transistor. The vertical pnp transistor often allows injection of plasma deep into the p-substrate. The injection of plasma deep into the p-substrate may lead to slow speed, if the depletion region expanding during the turn-off cannot reach it to swipe it off. The remaining plasma may be cleared by recombination which is often a slow process.

In addition to the two pnp transistors described above there is a third pnp transistor, having a vertical orientation. We shall now call this transistor the second vertical pnp transistor. This second vertical pnp transistor is similar to the vertical pnp transistor described above, as both transistors share a common emitter (p+ region connected to the anode/drain terminal) and a common base (n-drift region, and/or n-well region if present). However the collector region of the second vertical transistor is not connected to the cathode/source terminal but rather to a metal (e.g., silver)-filled epoxy which is used on the back of the substrate as a die attach for packaging. This die attach forms a back-side terminal, or a back terminal, of the LIGBT. The use of such a back terminal is advantageous in most IC applications. A back terminal may provide, for example, improved thermal and/or electrical behaviour. In IC applications the back terminal is preferably grounded.

Given that the substrate is lowly doped, the contact between this metal-filled epoxy and the substrate is not ohmic and forms a Schottky barrier. The metal (silver)-enriched epoxy then acts as a source of electrons (in a similar way to an n type layer) becoming the emitter of a parasitic npn transistor formed between the metal (silver) filled epoxy (as emitter), the lowly doped substrate (as base) and the drift region, and/or n-well buffer region (as collector). This parasitic npn transistor together with the second vertical pnp transistor form a parasitic thyristor. It is therefore very preferable that this thyristor is inhibited at all times, since its operation could slow down the device during turn-off and possibly lead to latch-up and ultimately thermal failure.

Figure 28:
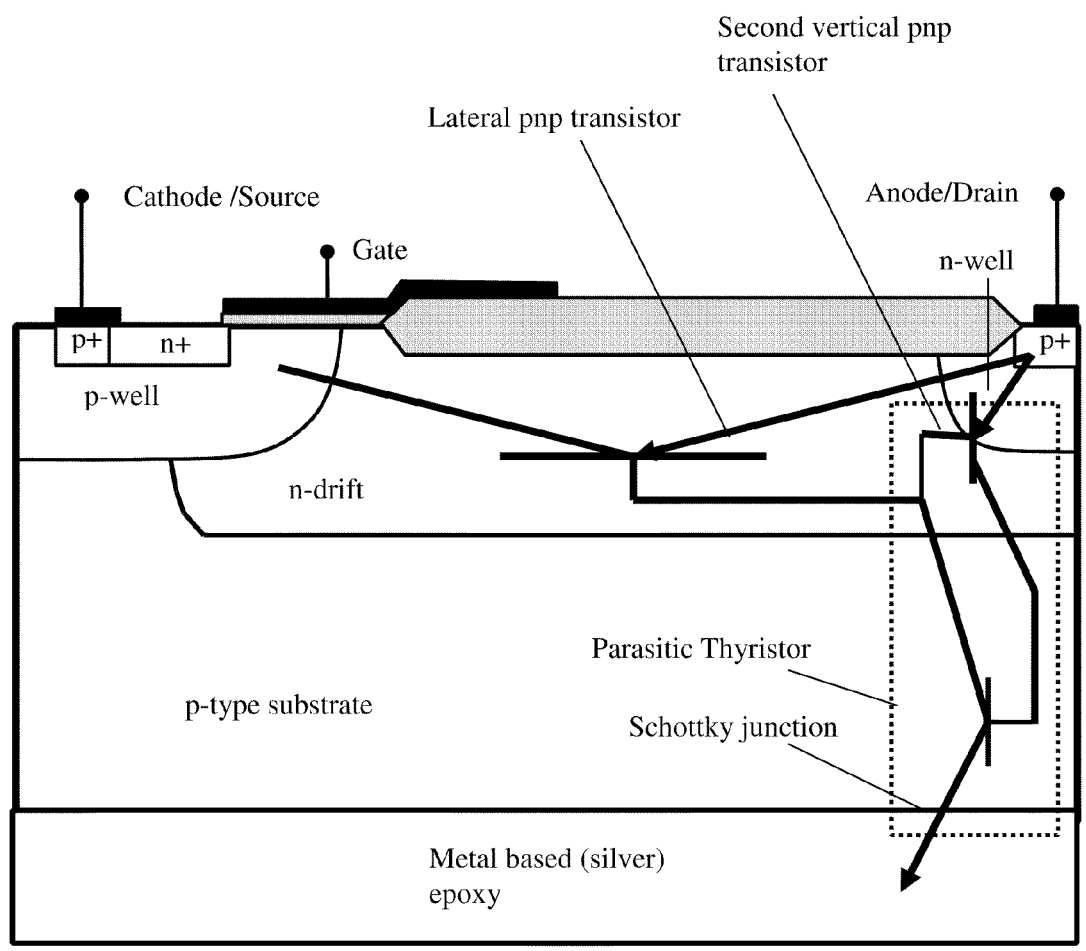
FIG. 28 shows an LIGBT having a parasitic thyristor, formed of a second vertical pnp transistor and a parasitic npn transistor having a Schottky junction as a base-emitter junction.
Figure 29:
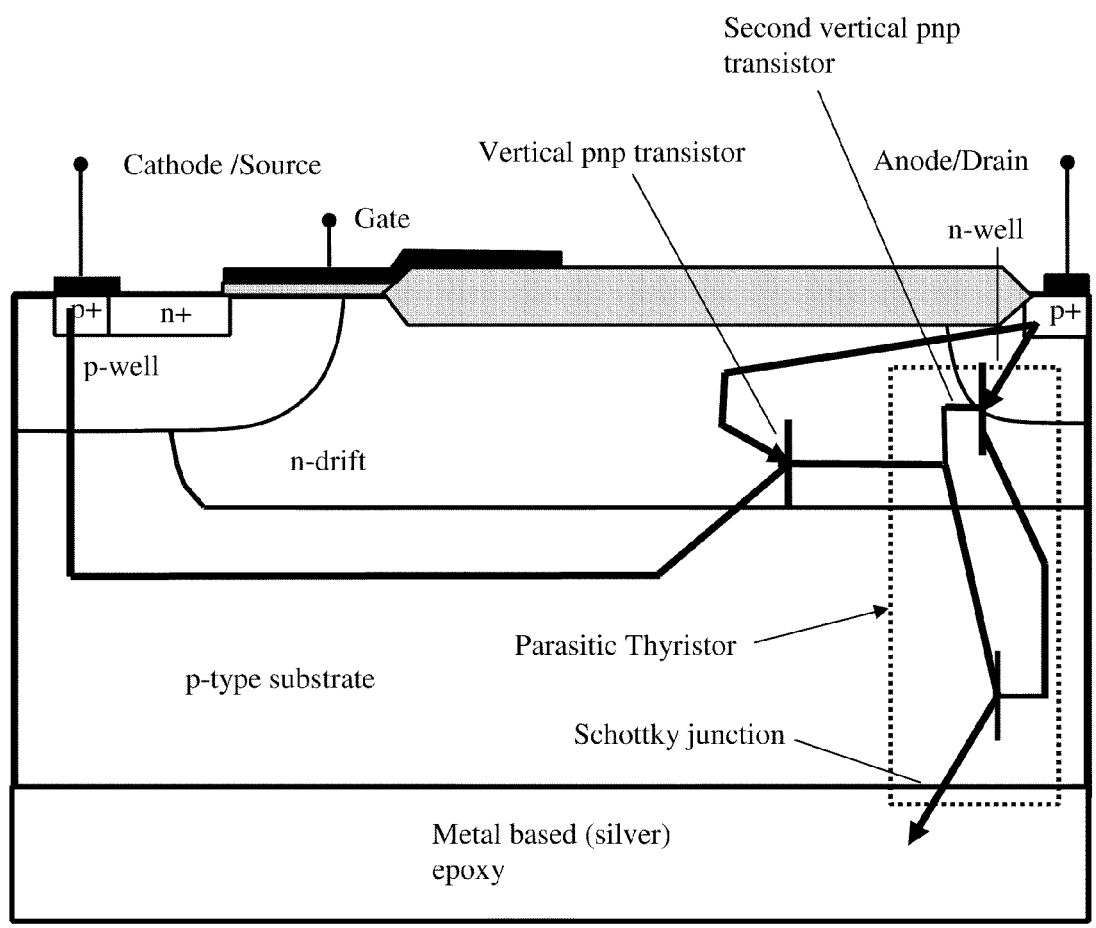
FIG. 29 shows the same thyristor as in FIG. 28 together with a first vertical pnp transistor (with the collector connected to the source/cathode)
Figure 33:
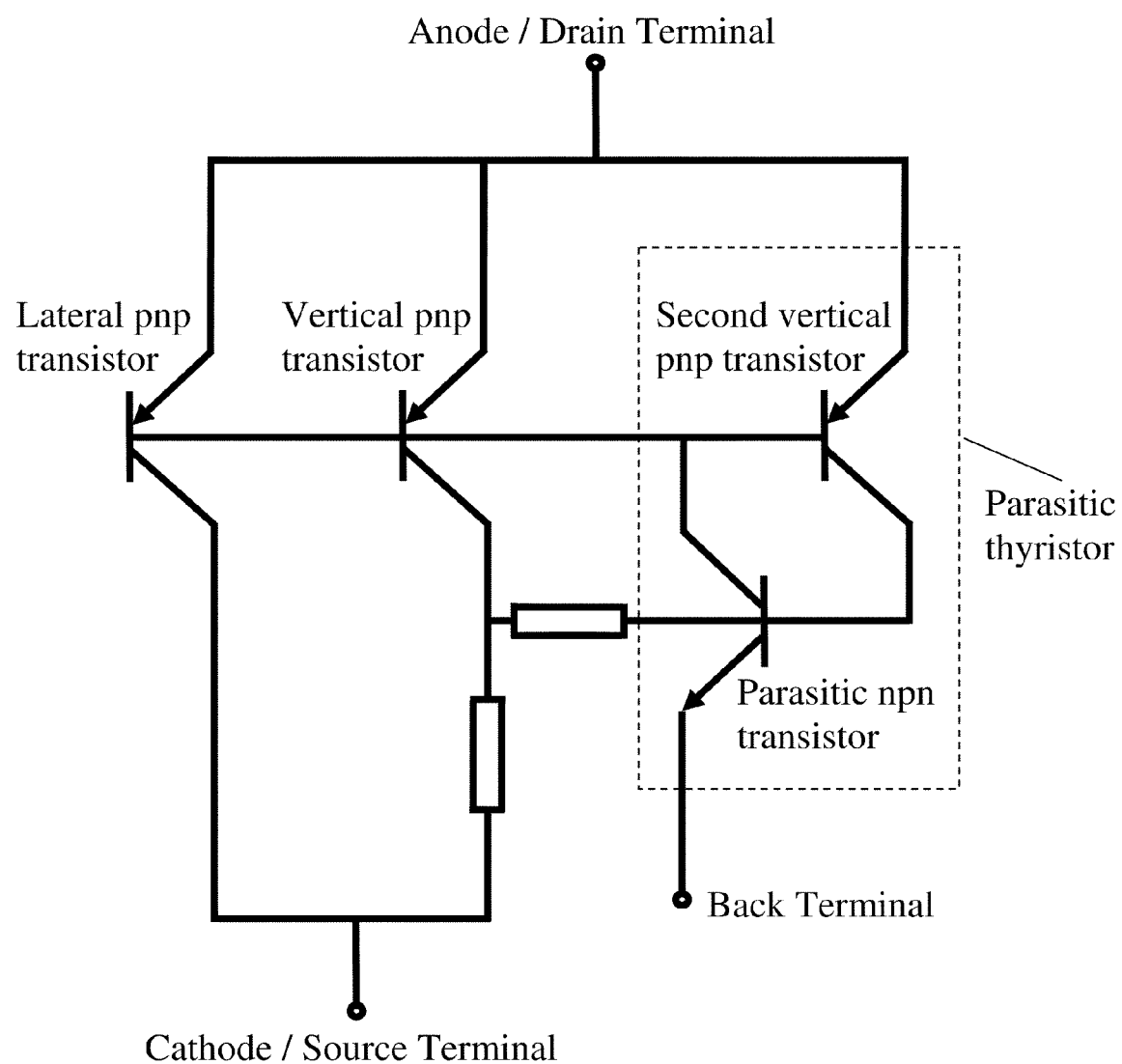
FIG. 33 shows an equivalent electrical connection diagram of an LIGBT, showing relationships between the lateral pnp, first vertical pnp, second vertical pnp and parasitic npn transistors that may be found for example in any one of the devices of FIGS. 28-32 or any bulk silicon n-channel LIGBT described herein, and the parasitic thyristor formed by the two latter transistors.

In FIG. 28 the parasitic thyristor, formed of the two transistors, the second vertical pnp and the parasitic npn, having the Schottky junction as the base-emitter junction, is shown. The lateral pnp transistor and its base connection to the thyristor is shown. Similarly in FIG. 29 the same thyristor is shown together with the first vertical pnp transistor (with the collector connected to the source/cathode, broadly corresponding to that shown in FIG. 2). FIG. 33 presents an equivalent electrical connection diagram, showing the relationships between the lateral pnp, vertical pnp, second vertical pnp and parasitic npn transistors, and the parasitic thyristor formed by the two latter transistors. The three pnp transistors all share the same emitter and base, being respectively the p+ region connected to the anode/drain terminal and the n-well region and/or n-drift region. However the collector of each pnp transistor relates to a different region of the LIGBT: the collector of the lateral pnp transistor is formed by the p-well region, connected to the cathode/source terminal via the p+ short region. The collector of the vertical pnp transistor is formed by the p-type substrate, and is dominated by the region of that substrate which is closer to the p-well region, connected to the cathode/source terminal via the p+ short region. The collector of the second vertical pnp transistor is also formed by the p-type substrate, however it is dominated by the region of that substrate lying further from the p-well region. This region of the substrate is connected to the back terminal of the LIGBT via the metal-filled epoxy.

In vertical devices, the plasma level and distribution in an IGBT is adjusted by increasing the recombination rate through lifetime killing or by lowering the injection efficiency of the anode (called also drain/collector) junction. The former may be done by electron irradiation or local implantation of Helium while the latter is done by forming the anode region post top surface metallization (i.e. after the surface layers, contacts and metal tracks are formed) followed by rapid thermal annealing to activate the impurities to an equivalent doping of $1 \cdot 10^{17}$ cm$^{-3}$ to $5 \cdot 10^{17}$ cm$^{-3}$. Given that the thickness of this layer is also around 1 to 1.5 µm, this layer behaves as 'transparent' to electrons, allowing a reduced hole injection and therefore reduced plasma formation. The back metalization is applied after the p transparent anode is formed. This metalization may be made of a combination of materials such as Nickel, Titanium, Aluminium to give an ohmic contact (i.e. avoid Schottky contact) and have good adhesion to the back surface. The application of both aforementioned methods to control the plasma in lateral devices (suitable for integration) has serious drawbacks. Use of electron irradiation or Helium implant are not considered to be a 'clean process' which can result in significant changes in the threshold voltages in the control circuitry and thus lead to a poor yield. The second, the injection control method, may imply the need to introduce a post-metalization semiconductor layer at the surface (as opposed to the back of the wafer as it is the case in vertical devices). This is virtually impossible in lateral devices where no layers can be formed and made contact to, after the metallization is done. In addition doping levels below $5 \cdot 10^{17}$ cm$^{-3}$ can also give Schottky contact with standard CMOS Aluminium metallization.

Figure 3:
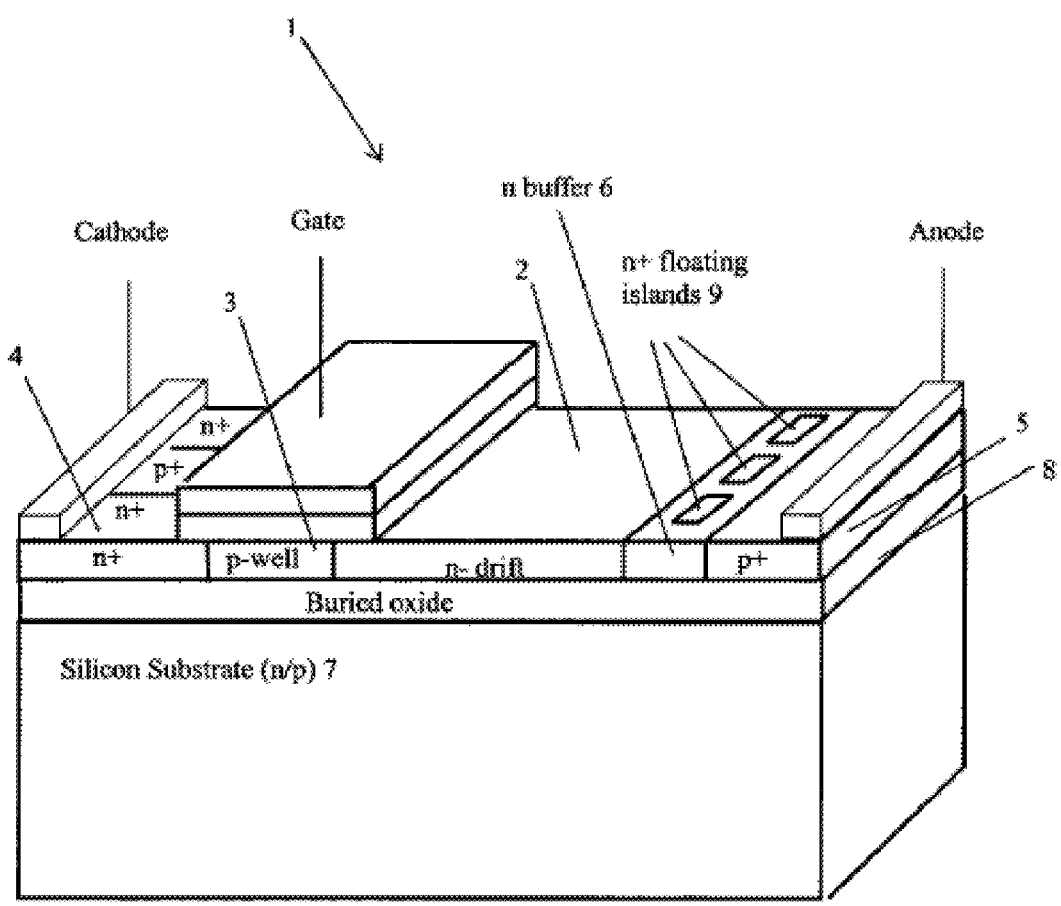
FIG. 3 shows schematically a perspective view of a state of the art LIGBT which uses n+ islands in a thin drift region as described fully in U.S. Pat. No. 7,381,606 (referenced above)

In U.S. Pat. No. 7,381,606 (F. Udrea, Cambridge Semiconductor Ltd., published Mar. 20, 2008) a method to adjust the injection efficiency in lateral IGBTs by placing surface n+ floating island regions within the n-buffer is described (FIG. 3). These n+ regions are formed at the same time with the source/drain regions of the MOSFET transistors and hence do not require additional processing steps. The width and the spacing of these regions can be adjusted simply by layout modification and which can result in significant change in the plasma level and distribution. This method is applied to thin drift regions, as the n+ regions can only adjust the current injection when the current flows at or close to the surface. The hole current flows between the n+ regions and virtually no current flows directly through the n+ regions, as the very high concentration of donor atoms inside these regions blocks the flow of holes through them. This could be seen as a reduction in the injection efficiency of the p+/n-buffer junction. The method is thus effective for thin drift layers, typically under 1 µm, and its use is of less or no importance for thicker drift layers, above 1 µm. Since the current density capability is increasing with the thickness of the drift layer, it would be desirable to use a drift region thickness well in excess of 1 µm. For example in a bulk LIGBT, the effective thickness through which the most significant current flows can be 20 to 200 microns and therefore the method proposed in U.S. Pat. No. 7,381,606 is not applicable. In addition, in U.S. Pat. No. 7,381,606, the doping of the buffer region and the p+ anode region are unchanged compared to a similar conventional device. The injection efficiency of the junction can therefore be adjusted solely by modifying the geometrical dimension and position of the said n+ surface islands and the distance between the islands.

In the first arrangement of the present invention, there is provided a LIGBT where the p type anode injector, connected to the anode terminal (i.e. the high voltage terminal) is lowly doped enough to ensure a low enough injection of holes to speed up the turn-off of the device but highly doped enough to ensure an ohmic contact with CMOS metalization layer based on Aluminium or Copper.

Preferably the doping concentration of the p type anode injector is between $5 \times 10^{17}$ cm-3 and $1 \times 10^{19}$ cm-3. The exact doping level can be adjusted by the implantation dose to ensure a favourable trade-off between the on-state voltage drop and on-state losses on one hand and turn-off time and turn-off losses on the other hand. The optimisation of the on-state versus switching losses preferably takes into account the particular application and the system parameters such as switching frequency, duty cycle, output capacitance, etc.

Preferably the thickness of p type anode injector is between 0.1 to 1 µm.

Preferably the p type anode injector is formed within the CMOS sequence and does not require additional processing.

Preferably the p type anode injector is formed at the same time (within the same process step) with the p type short region of the cathode (source) contact. The p type short region is in contact with the p well at the cathode side (i.e. source side) of the device and collects the holes that traverse the drift region.

Preferably the p type anode injector can be formed at the same time with the sources or drains of other p-channel transistors, or p type contact layers to the wells of other n channel transistors present in the power IC.

Alternatively the p type anode injector has a lower doping concentration than the p type short region of the cathode (source) contact.

Alternatively the p type anode injector has a lower doping concentration than the sources or drains of other p-channel transistors or contact layers to the wells of other n channel transistors present in the power IC.

In other LIGBTs the anode injector may be formed of a highly doped p+ layer, which may have a doping concentration of $1 \times 10^{20}$ cm$^{-3}$ to $5 \times 10^{20}$ cm$^{-3}$. The electrons reaching the p+ are converted into or trapped by majority holes inside the p+ layer and virtually no electrons reach the anode terminal. This means that the injection efficiency of the anode junction is close to 1 and that the plasma level present in the on-state is very high, leading to high turn-off losses. In contrast, in the present arrangement of the invention, the p anode layer is relatively lowly doped, between $5 \times 10^{17}$ cm$^{-3}$ and $1 \times 10^{19}$ cm$^{-3}$, and as a result a large fraction of electrons can penetrate the p type anode injector to reach the anode terminal. Therefore, the injection efficiency of the anode junction is below 1 (typically between 0.5 and 0.9). The gain of the pnp transistor is directly proportional to the injection efficiency, so this is also reduced. This results in a more favourable trade-off between turn-off speed and on-state performance.

In the second arrangement of the present invention, there is provided a LIGBT that features a floating n+ surface layer at the surface, adjacent to the p anode injector and adjacent to the drift region. The n+ surface layer acts as an Auger recombination region to reduce the pnp transistor(s) gain and hence reduce the plasma formed in the drift region in order to enhance the turn-off speed and minimise the turn-off losses. A pnp transistor to have such reduced gain may be the lateral pnp transistor and/or a vertical transistor such as the vertical pnp transistor of FIG. 2 or first vertical transistor of FIG. 33.

By "floating" is meant that this region is not connected directly to a terminal.

Preferably the doping concentration of the floating n+ surface layer is between $1 \times 10^{20}$ cm$^{-3}$ and $1 \times 10^{21}$ cm$^{-3}$. The depth of the layer is typically between 0.1 and 1 µm. The length of the n+ layer can be adjusted by layout design to ensure a favourable trade-off between the on-state voltage drop and on-state losses on one hand and turn-off time and turn-off losses on the other hand. The longer the n+ layer the higher the recombination rate, the lower the plasma formed in the drift region and hence the faster the turn-off. The optimisation of the on-state versus switching losses needs to take into account the particular application and the system parameters such as switching frequency, duty cycle, output capacitance, etc. Typical n+ length can be between 5 and 50 µm.

Preferably the floating n+ surface layer is enclosed by an n well which serves as a buffer for stopping the electric field to reach the anode region (i.e. avoid punch-through) in the off-state voltage blocking mode.

Preferably the floating n+ surface layer is formed within the CMOS sequence and does not require additional processing.

Preferably the floating n+ surface layer is formed at the same time (within the same process step) with the cathode (source) n+ region.

Preferably the floating n+ surface layer is formed at the same time with the sources or drains of other n-channel transistors, or n type contact layers to the wells of other p channel transistors present in the power IC.

A mechanism by which the n+ surface layer lowers the gain of the pnp transistor(s) and hence decreases the plasma inside the drift region is described below:

The recombination rate which is responsible for lowering the plasma formation during high level injection is made of three parts: the direct recombination, the Scholley-Hall Recombination and the Auger recombination:

$$U = U_{SHR} + U_{Auger} + U\mathrm{dir}$$

The direct recombination is generally negligible in Silicon while the $U_{SHR}$ is inverse proportional with the lifetime of the carriers. Adjusting the local lifetime of carriers near the anode side of the drift region is a method usable in vertical devices, but its use in lateral devices is cumbersome and expensive. The Auger recombination is dependent on the doping of the buffer and becomes visible only when very high doping regions are present. The increase in the Auger recombination rate leads to a reduction in the plasma injection in the drift region and substrate (where applicable) and as a result, an increase in the turn-off speed and reduction in the switching losses. However, one preferably does not use very highly doped buffers (say above $10^{17}$ cm$^{-3}$) as these may completely kill the pnp bipolar transistor(s) and thus end up with no plasma in the drift region which may lead to unacceptably high on-state losses.

It is an advantage of this arrangement to provide an LIGBT with an additional floating n+ surface layer placed between the drift region and the p anode injector region, preferably inside an n buffer, to reduce the pnp transistor gain, and therefore to reduce the plasma accumulated in the on-state and thus increase the switching speed. The length of this layer adjusts recombination rate which in turn adjusts the plasma level inside the device.

In the third arrangement, there is provided a LIGBT that features a floating n+ buried layer below the p anode injector. The floating n+ buried layer acts to reduce the injection efficiency of the anode junction and additionally acts as an Auger recombination region. Both these effects lead to a reduction in the pnp transistor gain and hence a decrease in the plasma formed in the drift region. As a result the device has increased turn-off speed and lower turn-off losses. A pnp transistor to have such reduced gain may be the lateral pnp transistor and/or a vertical transistor such as the vertical pnp transistor of FIG. 2 or first vertical transistor of FIG. 33.

By "floating" is meant that these regions are not connected directly to a terminal.

Preferably the doping concentration of the floating n+ buried layer is between $1 \times 10^{18}$ cm$^{-3}$ and $1 \times 10^{20}$ cm$^{-3}$. The thickness of the buried layer is typically between 0.5 and 10 µm. Typically, the n+ buried layer length can be between 5 and 50 µm.

The doping, the thickness and the length of the n+ layer can be adjusted by process or layout design to ensure a favourable trade-off between the on-state voltage drop and on-state losses on one hand and turn-off time and turn-off losses on the other hand. The optimisation of the on-state versus switching losses needs to take into account the particular application and the system parameters such as switching frequency, duty cycle, output capacitance, etc.

Preferably the floating n+ buried layer reduces more the gain of the 'vertical' pnp transistor than the 'lateral' pnp transistor to give a favourable turn-off speed and preserve good on-state conduction.

Preferably the floating n+ buried layer is enclosed by or adjacent to an n well that serves as a buffer for avoiding the electric field to touch the anode junction (i.e. prevention of punch-through) during the off-state voltage blocking mode.

Preferably the floating n+ buried layer is formed within the CMOS or BCD (Bipolar CMOS DMOS) sequence and does not require additional processing. (As for any device embodiment of any of the aspects or arrangements described herein, the LIGBT may be a Bipolar CMOS (Complementary Metal Oxide) DMOS (Double-Diffused Metal Oxide Semiconductor) device).

Preferably the floating n+ buried layer is formed at the same time (within the same process step) with other buried n+ layers, such as that of the buried collector region in a npn transistor integrated in a BCD process or the buried n+ drain for integrated VDMOSFETs or an isolation n+ buried layer.

In the fourth arrangement, which may be present in any combination of one or more of the first to third arrangements, there is provided a LIGBT comprising a second vertical pnp transistor which is connected to a parasitic npn transistor in a thyristor configuration, wherein the current gain of the second vertical pnp transistor is lowered such that said thyristor is inactive in each and all operation modes including extreme conditions of operation. The said second vertical pnp transistor has the emitter formed by the p+ region connected to the anode/drain terminal, the base formed by the n-drift region, and/or n-well (buffer) region if present and the collector region formed by the p-lowly doped substrate in direct contact to a metal (silver)-filled epoxy which is used on the back of the substrate as a die attach for packaging. The parasitic npn transistor has the emitter formed by the metal (silver)-filled epoxy, the base formed by the lowly doped p-substrate and the collector formed by the n-drift region and/or n-well (buffer) region if present.

In this fourth arrangement, the current gain of said second vertical pnp transistor, $\alpha_v$ is lowered so that when $\alpha_v$ is added to the current gain of the parasitic bipolar transistor, $\alpha_p$, the result is smaller than unity.

Figure 2:
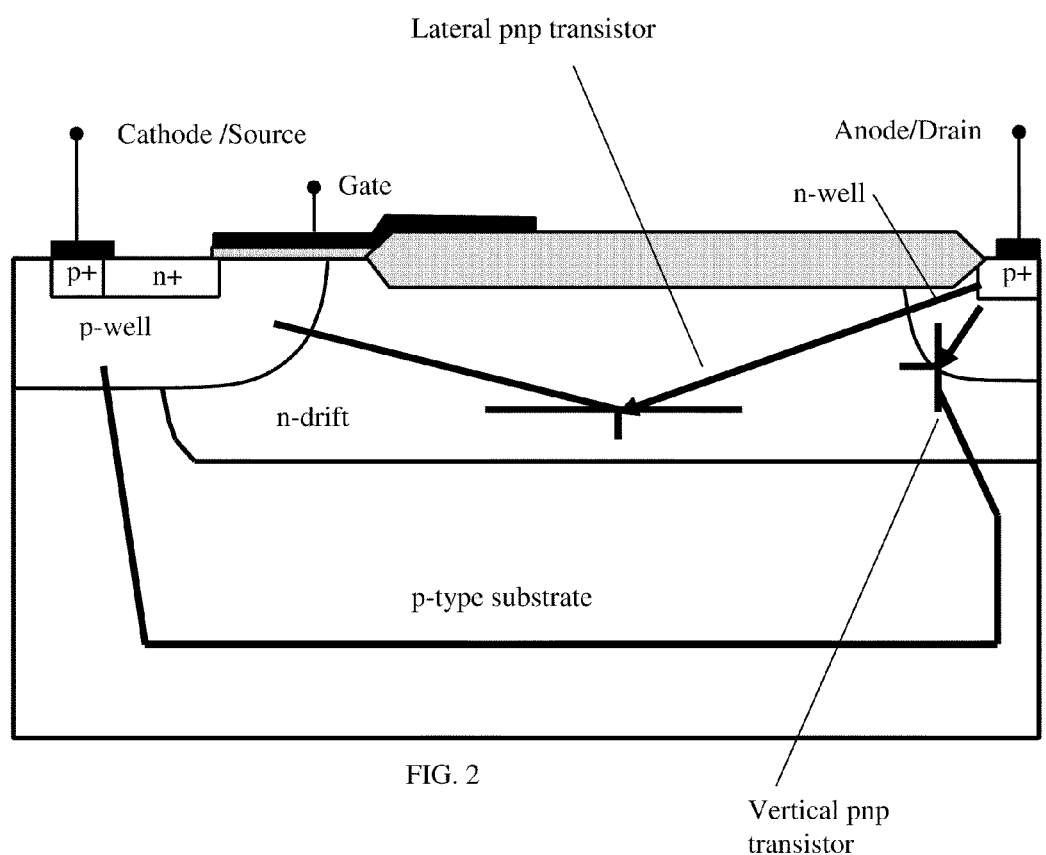
FIG. 2 shows schematically the presence of the two pnp bipolar transistors together in a LIGBT in bulk technology.

In any one of the above first to third arrangements, preferably in combination with the fourth arrangement, the gain of the pnp transistor(s) (e.g., the lateral pnp transistor and/or a vertical transistor such as the vertical pnp transistor of FIG. 2 or first vertical transistor of FIG. 33) may be reduced and the plasma level inside the drift region may be adjusted by either introducing n+ layers close to the anode injector or lower the doping of the p anode injector. The presence of the floating n+ surface or buried layer and/or the lower doping of the p anode injector may allow for very fast turn-off of the device with low transient losses. The trade-off between on-state and transient losses may be adjusted efficiently without modifying substantially the fabrication process. Alternatively or additionally each of the first to third arrangements described above (e.g., an LIGBT having the floating n+ surface region and/or the floating buried layer and/or the lower doping of the p anode injector) may lead to a reduction in the current gain of the above second vertical pnp transistor and therefore may minimise the effect of the break-over (i.e. the activation) and/or the latch-up of the parasitic thyristor, preferably as in the fourth arrangement. If the sum of the current gain of the second vertical pnp transistor $\alpha_V$ and that of the parasitic npn transistor $\alpha_p$ is smaller than unity, then the thyristor remains passive. This should be the case in all conditions and operating modes including the extreme operation (maximum current, maximum temperature and maximum voltage).

Preferably an LIGBT of any one of the four arrangements is used in power ICs monolithically integrated with other devices or CMOS circuits.

Preferably an LIGBT of any one of the four arrangements is used in conjunction with bulk CMOS technology or Junction Isolation technology where the n-drift region is formed inside a p-substrate. The single RESURF, double RESURF or multiple RESURF concepts may be used to increase the breakdown ability of the device.

Preferably, in any one of the above arrangements, the thickness of the drift region is greater than 1 μm and typically between 3 to 20 μm. Additionally or alternatively the effective thickness through which the current flows, which includes the drift region thickness and part of that of the p-substrate below it, is preferably greater than 20 μm.

Alternatively, an LIGBT of any one of the first to third arrangements in particular is used in conjunction with Silicon on Insulator (SOI) technology with the thickness of the drift region greater or equal to 1 μm (typically between 1 and 20 μm).

Alternatively, an embodiment of an LIGBT of any one of the first to third arrangements in particular may be used in conjunction with the membrane technology described more fully in the patent documents WO-A-02/25700 (Udrea, Cambridge Semiconductor Ltd., published 2006-03-02), U.S. Pat. No. 6,703,684 (Udrea, Cambridge Semiconductor Ltd., published Apr. 11, 2002), US-A-2004-0084752 (Udrea, Cambridge Semiconductor Ltd., published May 6, 2004) and US-A-2004-0087065 (Udrea, Cambridge Semiconductor Ltd., published May 6, 2004) that are all hereby incorporated by reference. Preferably, the thickness of the drift region is greater or equal to 1 μm (typically between 1 and 20 μm).

Although the present specification mainly discusses a LIGBT, principles of the present invention are also applicable to other lateral devices such as power/high voltage diodes (PIN diodes or Schottky diodes), power (or high voltage) bipolar transistors or thyristors.

Figure 4:
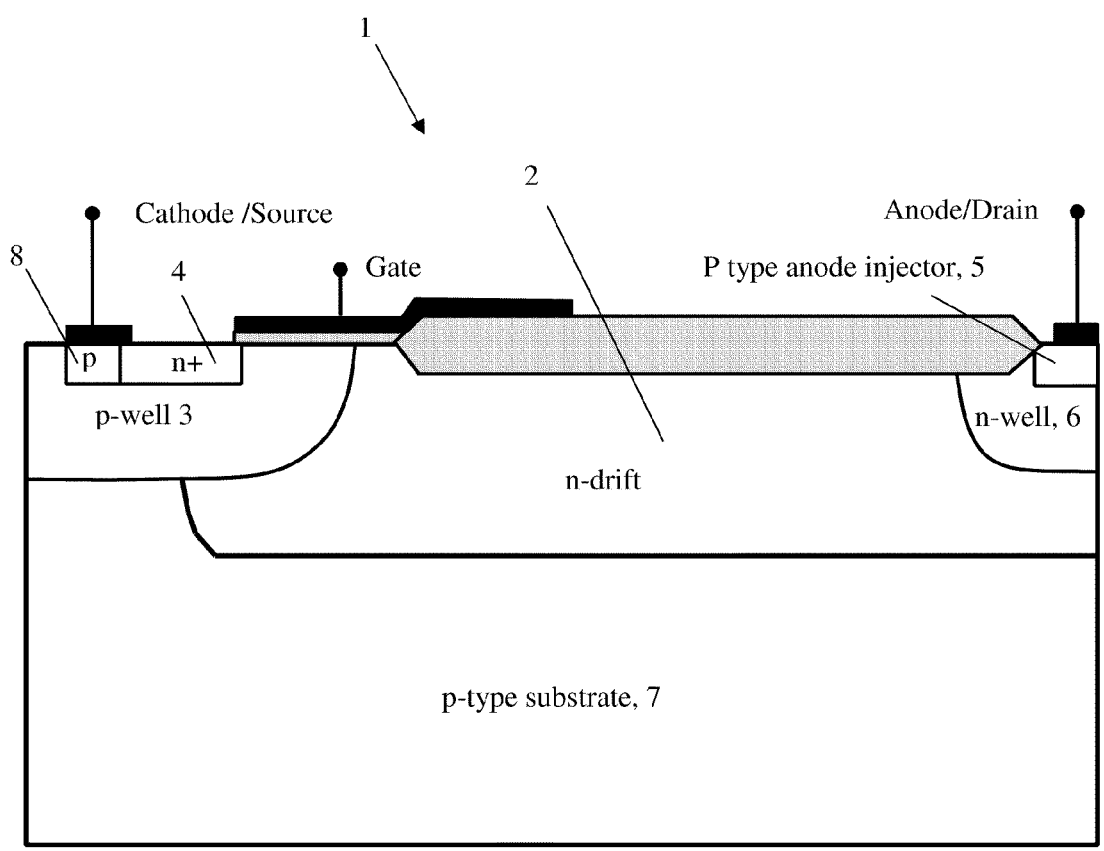
FIG. 4 shows schematically a cross-section view of a first example of a LIGBT according to the first arrangement of the invention.

Referring now to the drawings, FIG. 4 shows schematically a cross-section view of a first example of a high voltage/power LIGBT device 1 according to the first arrangement, this example using the bulk technology. The device 1 has a n-drift region 2 having first and second ends. At the first end of the drift region there is p-well region 3 which is further attached to an n+ cathode region 4, and to which a cathode terminal is fixed in use. The cathode region, 4 is shorted together with a p type region 8 which is in direct contact to the p-well 3. The MOS gate layers having a gate terminal attached thereto in use are formed over the p-well 3. At the second end of the drift region 2 there is the p type anode injector 5 to which an anode terminal is fixed in use. In this example, a n-well buffer region 6 is provided at the second end of the drift region 2 to separate the drift region 2 from the anode region 5. The active layers and regions described above are formed on a p− silicon substrate 7.

The p type anode injector, 5 can be preferably formed at the same time (in the same process step) with the cathode short region 8. Alternatively the p type anode injector, 5 is formed in a separate step from the cathode short region 8 and has lower doping concentration than that of short region 8.

The p type anode injector in the device according to the first arrangement is considerably more lowly doped (typically by at least one or even two orders of magnitude) than the p+ anode injector in a conventional, state-of-the-art LIGBT. This can be seen in FIG. 5 which shows schematically the doping profile of different layers (anode injector 5, n-well 6, n-drift region 2, and p-substrate, 7) in cut-line at the anode side of the device for a state-of-the-art LIGBT and the device of the first arrangement, as shown in FIG. 4. In this figure the peak concentration of the p+ anode injector in a state-of-the-art LIGBT is shown to be $5\times10^{20}$ cm$^{-3}$ while the peak concentration of the p type anode injector in the device according to the first arrangement is shown to be $1\times10^{18}$ cm$^{-3}$.

Figure 6:
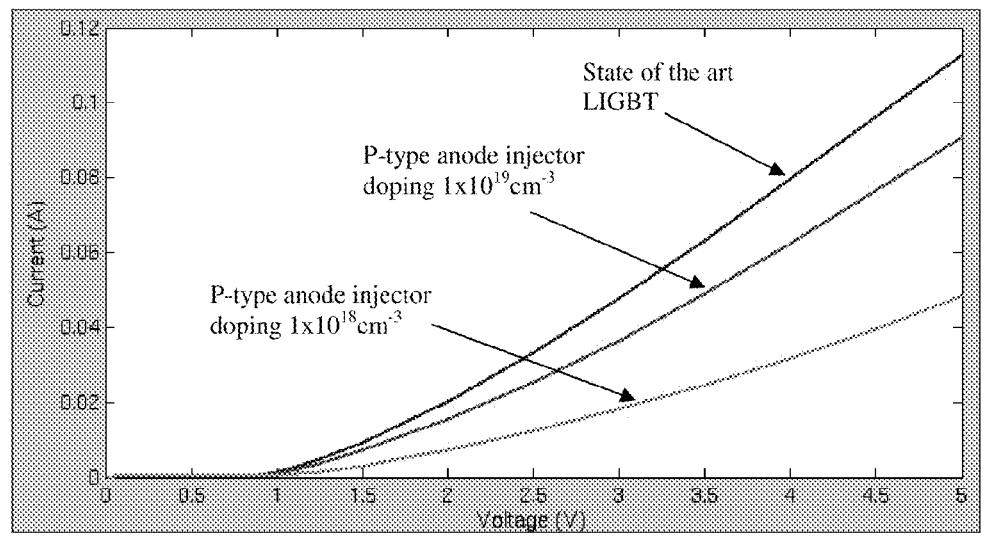
Figure 7:
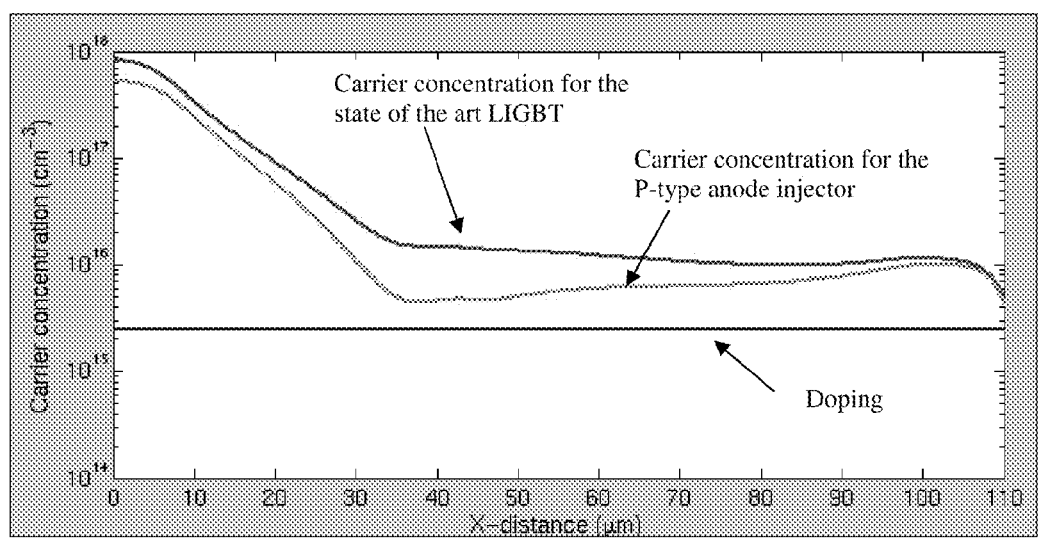

FIG. 6 shows the I-V characteristics in the on-state for a state-of-the-art LIGBT with a p+ anode injector of $5\times10^{20}$ cm$^{-3}$ compared to two examples of the device shown in FIG. 4 with a p type anode injector of $1\times10^{19}$ cm$^{-3}$ and $1\times10^{18}$ cm$^{-3}$ respectively. As can be seen the on-state current for the same voltage drop and same gate voltage decreases for the two examples according to the first arrangement compared to the state-of-the-art LIGBT. This is due to the lower gain of the pnp transistor, which leads to lower plasma level (FIG. 7) and hence less conductivity modulation in the n-drift region, and p-substrate in the two examples according to the first arrangement. The lower the concentration of the p anode injector, the lower the plasma level (FIG. 7) and hence the lower the on-state current.

The lower on-state performance is however accompanied by much faster switching speed and lower turn-off losses for the two examples according to the first arrangement compared to the state-of-the-art LIGBT. This is shown in FIG. 8. The lower the concentration of the p anode injector, the lower the plasma level and hence the higher the turn-off speed and the lower the energy losses as shown in FIG. 8.

Figure 9:
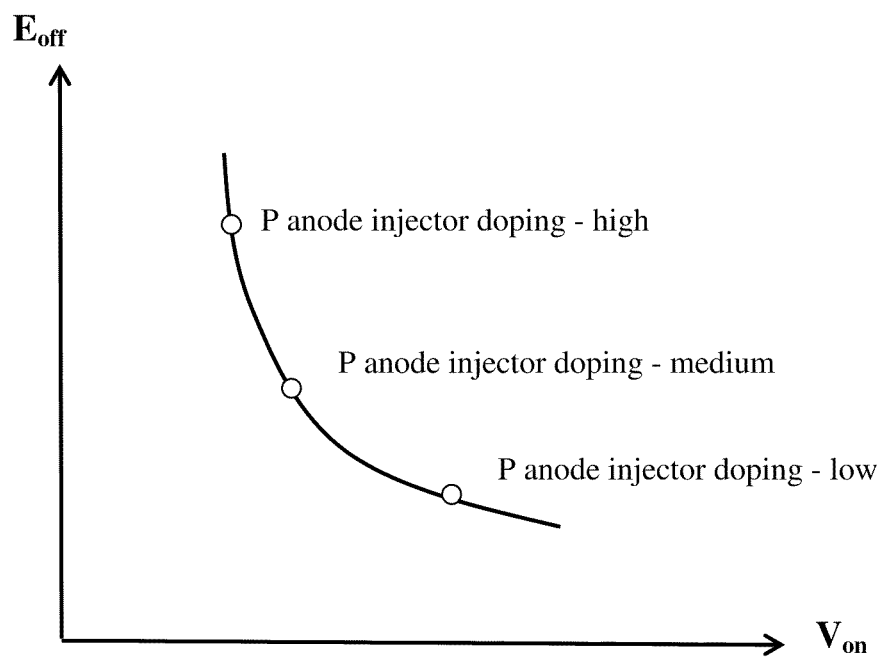
FIG. 9 shows schematically the trade-off between energy losses and on-state voltage drop for the device shown in FIG. 4 when the doping concentration of the p type anode changes.

FIG. 9 shows schematically the trade-off between the turn-off energy losses and on-state voltage drop for the device shown in FIG. 4 when the doping concentration of the p type anode changes. As the doping of the anode injector decreases, the p anode injector becomes 'even more transparent' to electrons, resulting in less injection of holes, and hence lower plasma. Consequently, the on-state voltage increases for the same current level, while the turn-off energy losses are sharply reduced.

Figure 10:
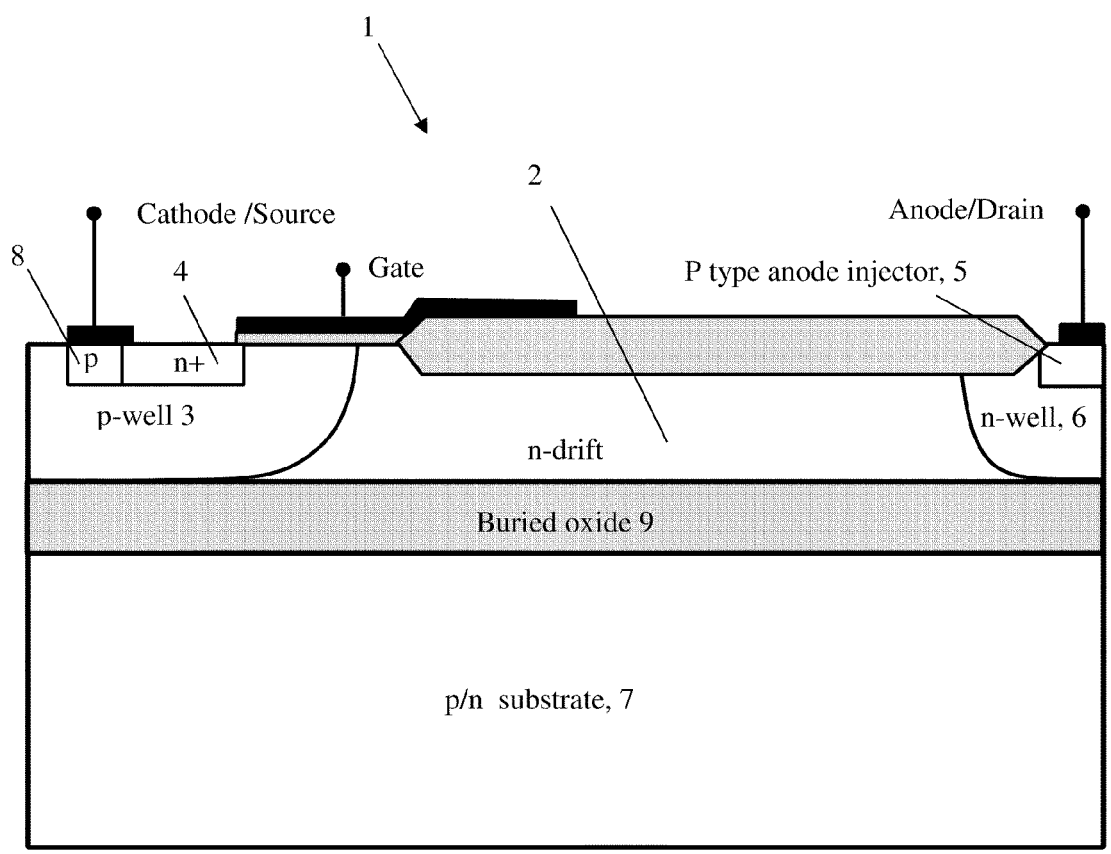
FIG. 10 shows schematically a cross-section view of a second example of a LIGBT according to the first arrangement of the invention.

FIG. 10 shows schematically a cross-section of a second example of a high voltage/power LIGBT device 1 embodiment of the first arrangement. Compared to the bulk technology example of FIG. 4, in the second example Silicon on insulator (SOI) is used. This uses a buried oxide 9 to isolate the p/n substrate, 7 from the upper layers. Other parts are the same and will not be discussed further herein.

Figure 11:
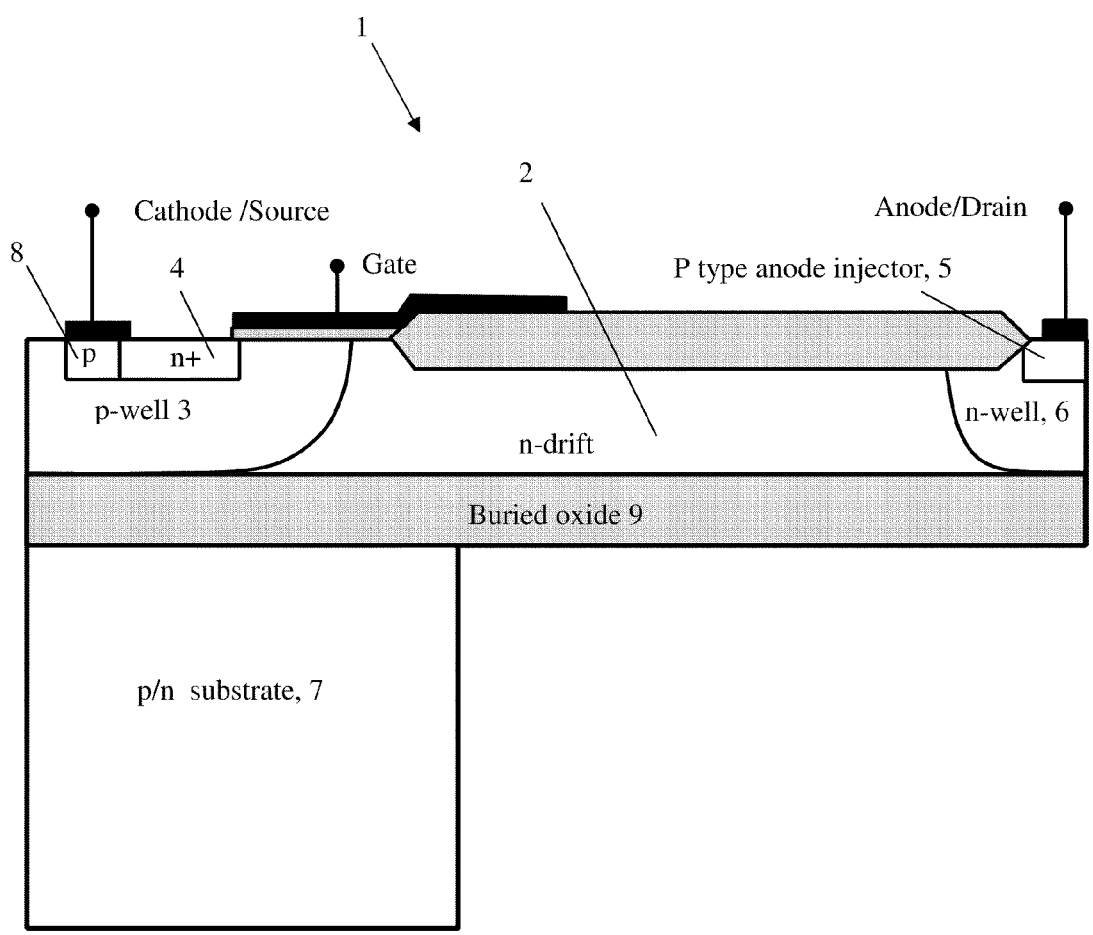
FIG. 11 shows schematically a cross-section view of a third example of a LIGBT according to the first arrangement of the invention.

FIG. 11 shows schematically a cross-section of a third example of another high voltage/power LIGBT device 1 embodiment of the first arrangement.

This example uses so-called membrane technology in which, compared to the FIG. 10 example, the silicon substrate 7 has been selectively removed or is otherwise selectively absent under the drift region 2 to allow an increase in the breakdown voltage. This membrane technology is described more fully in the above mentioned WO-A-02/25700, U.S. Pat. No. 6,703,684, US-A-2004-0084752 and US-A-2004-0087065.

Figure 12:
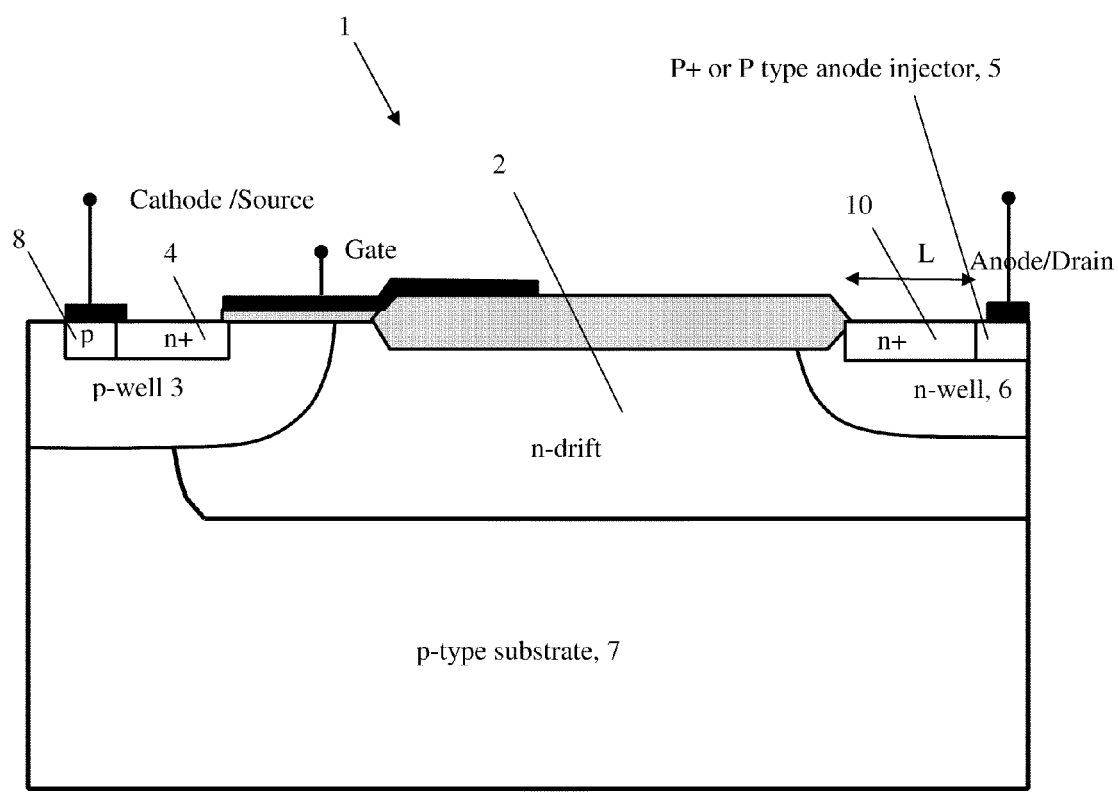
FIG. 12 shows schematically a cross-section view of a first example of a LIGBT according to the second arrangement of the invention.

FIG. 12 shows schematically a cross-section view of a first example of a high voltage/power LIGBT device 1 according to the second arrangement, this example using the bulk technology. The device 1 has a n-drift region 2 having first and second ends. At the first end of the drift region there is p-well region 3 which is further attached to an n+ cathode region 4, and to which a cathode terminal is fixed in use. The cathode region, 4 is shorted together with a p type region 8 which is in direct contact to the p-well 3. The MOS gate layers having a gate terminal attached thereto in use are formed over the p-well 3. At the second end of the drift region 2 there is a p+ and/or p type anode injector 5 to which an anode terminal is fixed in use. In this example, a n-well buffer region 6 is provided at the second end of the drift region 2 to separate the drift region 2 from the anode region 5. The active layers and regions described above are formed on a p− silicon substrate 7.

Adjacent to the p+ or p type anode injector, there is provided a floating n+ surface region, 10. This region is floating as it is not contacted to the anode terminal. The floating n+ surface region is preferably made at the same time (within the same process step) with the n+ cathode/source region and as such it does not require any extra fabrication step. The floating region and anode injector of FIG. 12 would extend back/out of the page if represented in three dimensions. Moreover, the floating semiconductor region may extend substantially continuously along substantially a complete length of said charge injection contact region in such a lateral direction.

The n+ surface region in the device embodiment according to the second arrangement acts as an Auger recombination centre to lower the plasma injected in the on-state and hence speed up the device during the turn-off. The length L shown in FIG. 12, is adjusted to allow a favourable trade-off between the on-state and turn-off performance.

Figure 13:
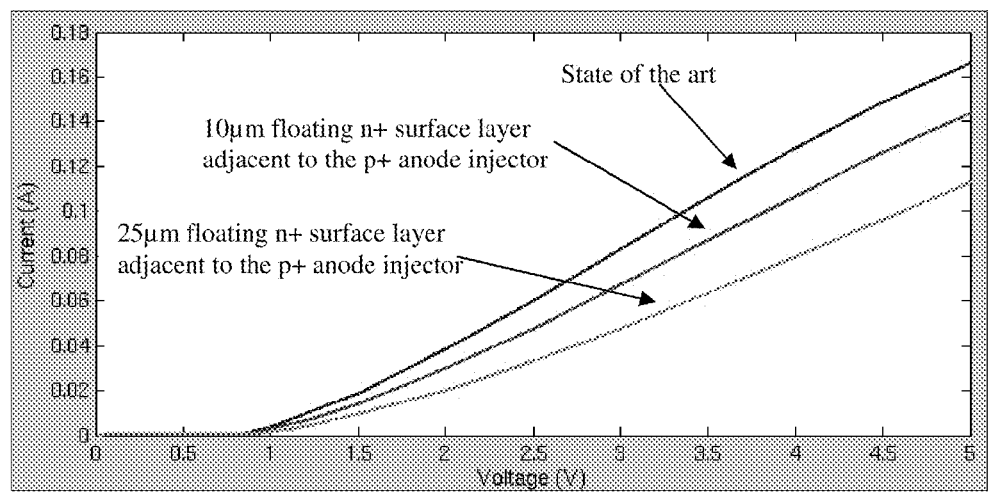
Figure 14:
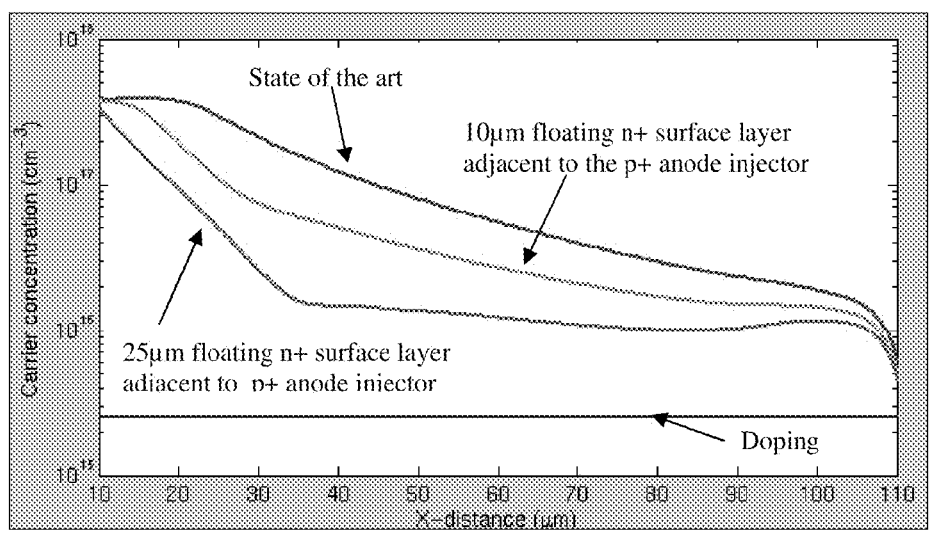

FIG. 13 shows the I-V characteristics in the on-state for a state-of-the-art LIGBT and two examples of the device shown in FIG. 12 the n+ surface layer length, L of 10 µm and 25 µm respectively. As can be seen the on-state current for the same voltage drop and same gate voltage decreases for the two examples according to the second arrangement compared to the state-of-the-art LIGBT. This is due to the lower gain of the pnp transistor, which leads to lower plasma level (FIG. 14) and hence less conductivity modulation in the n-drift region, and p-substrate in the two examples according to the second arrangement. The larger the length L, the lower the plasma level and hence the lower the on-state current.

The lower on-state performance is however accompanied by much faster switching speed and lower turn-off losses for the two examples according to the second arrangement compared to the state-of-the-art LIGBT. This is shown in FIG. 15. The larger the length L, the lower the plasma level and hence the higher the turn-off speed and the lower the energy losses as shown in FIG. 15.

Figure 16:
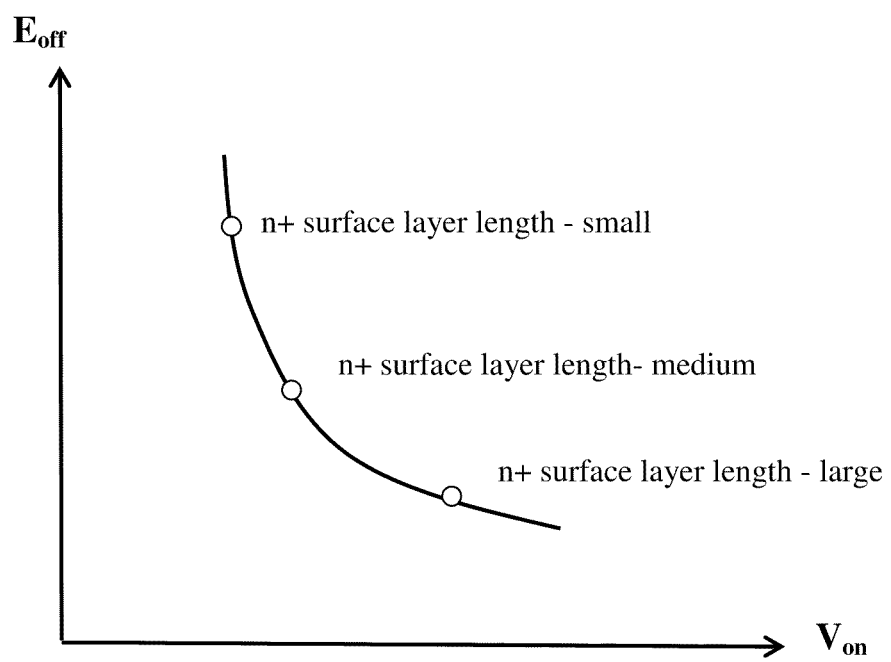
FIG. 16 shows schematically the trade-off between energy losses and on-state voltage drop for the device shown in FIG. 12 when the length of the floating n+ surface layer changes.

FIG. 16 shows schematically the trade-off between the turn-off energy losses and on-state voltage drop for the device shown in FIG. 12 when the length L changes. As L increases, the Auger recombination is stronger, resulting in lower plasma. Consequently, the on-state voltage increases for the same current level, while the turn-off energy losses are sharply reduced.

Figure 17:
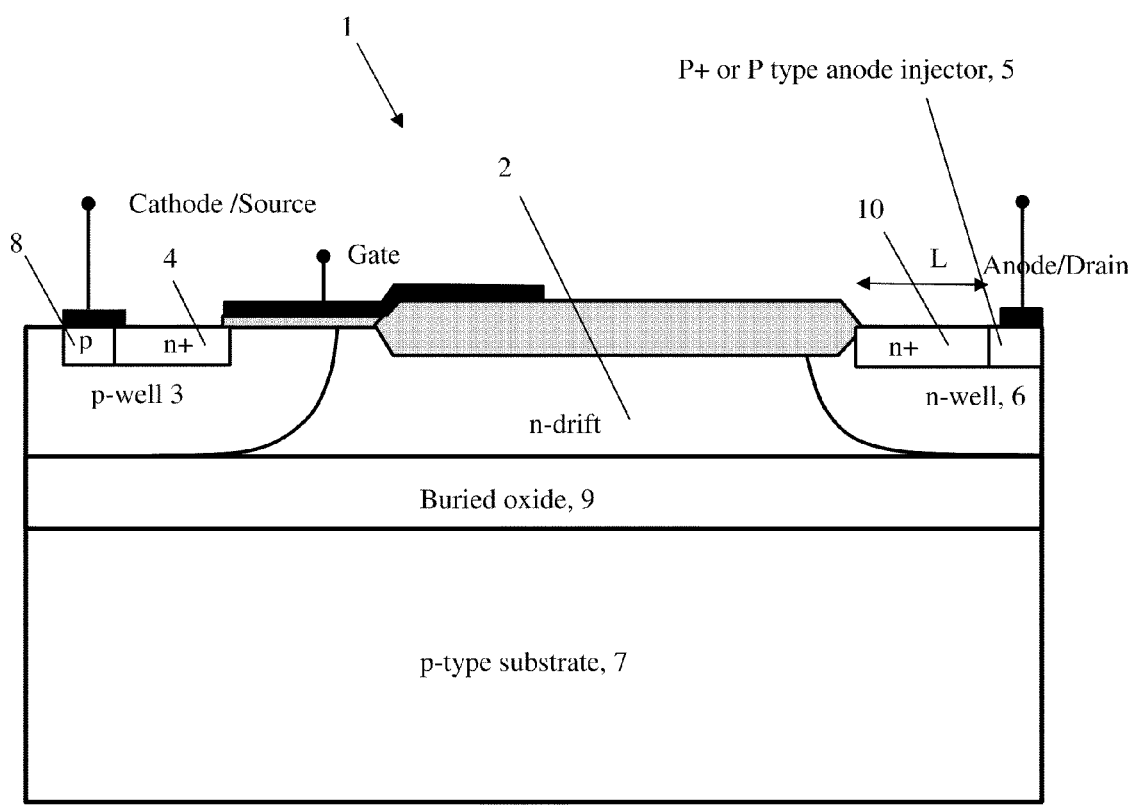
FIG. 17 shows schematically a cross-section view of a second example of a LIGBT according to the second arrangement of the invention.

FIG. 17 shows schematically a cross-section of a second example of a high voltage/power LIGBT device 1 embodiment of the second arrangement. Compared to the bulk technology example of FIG. 12, in the second example Silicon on insulator (SOI) is used. This technology is based on a buried oxide 9 to isolate the p/n substrate, 7 from the upper layers. Other parts are the same and will not be discussed further herein.

Figure 18:
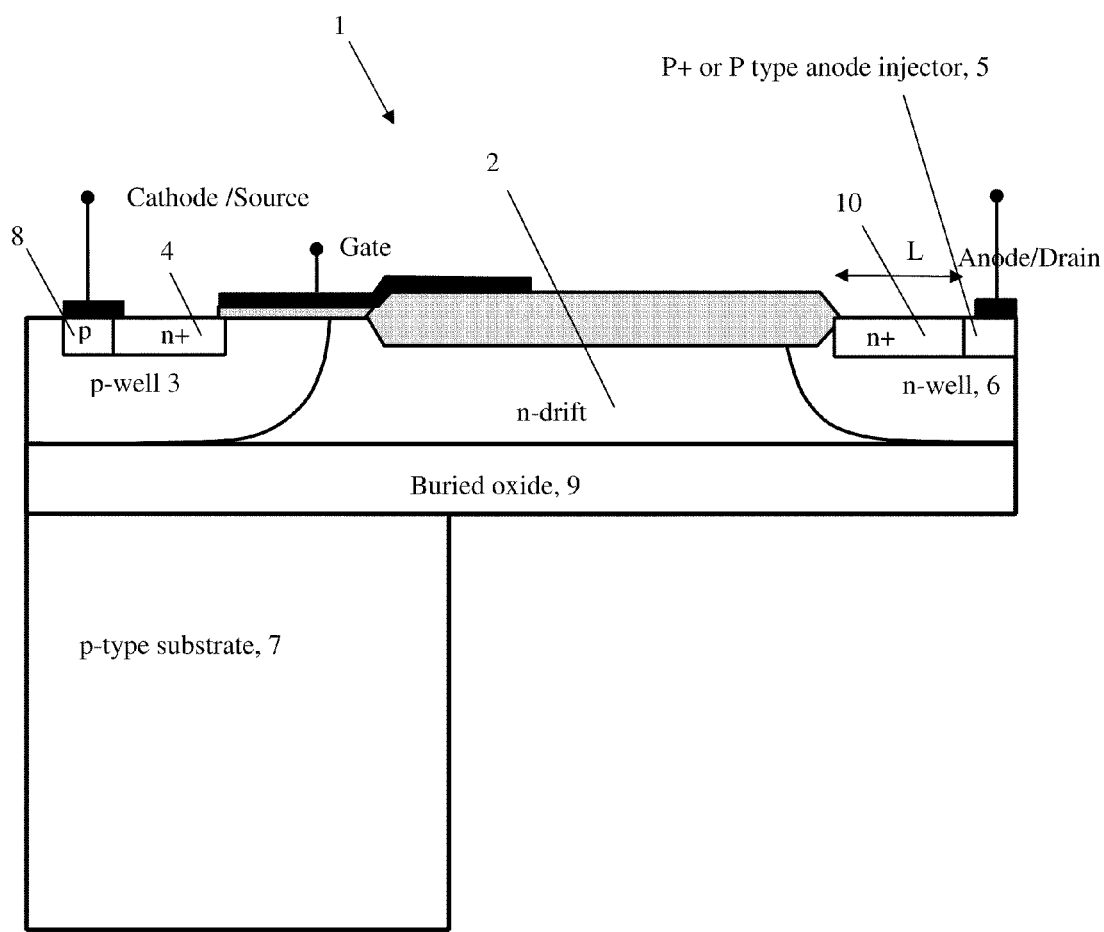
FIG. 18 shows schematically a cross-section view of a third example of a LIGBT according to the second arrangement of the invention.

FIG. 18 shows schematically a cross-section of a third example of another high voltage/power LIGBT device 1 embodiment of the second arrangement.

This example uses so-called membrane technology in which, compared to the FIG. 17 example, the silicon substrate 7 has been selectively removed or is otherwise selectively absent under the drift region 2 to allow an increase in the breakdown voltage. This membrane technology is described more fully in the above mentioned WO-A-02/25700, U.S. Pat. No. 6,703,684, US-A-2004-0084752 and US-A-2004-0087065.

Figure 19:
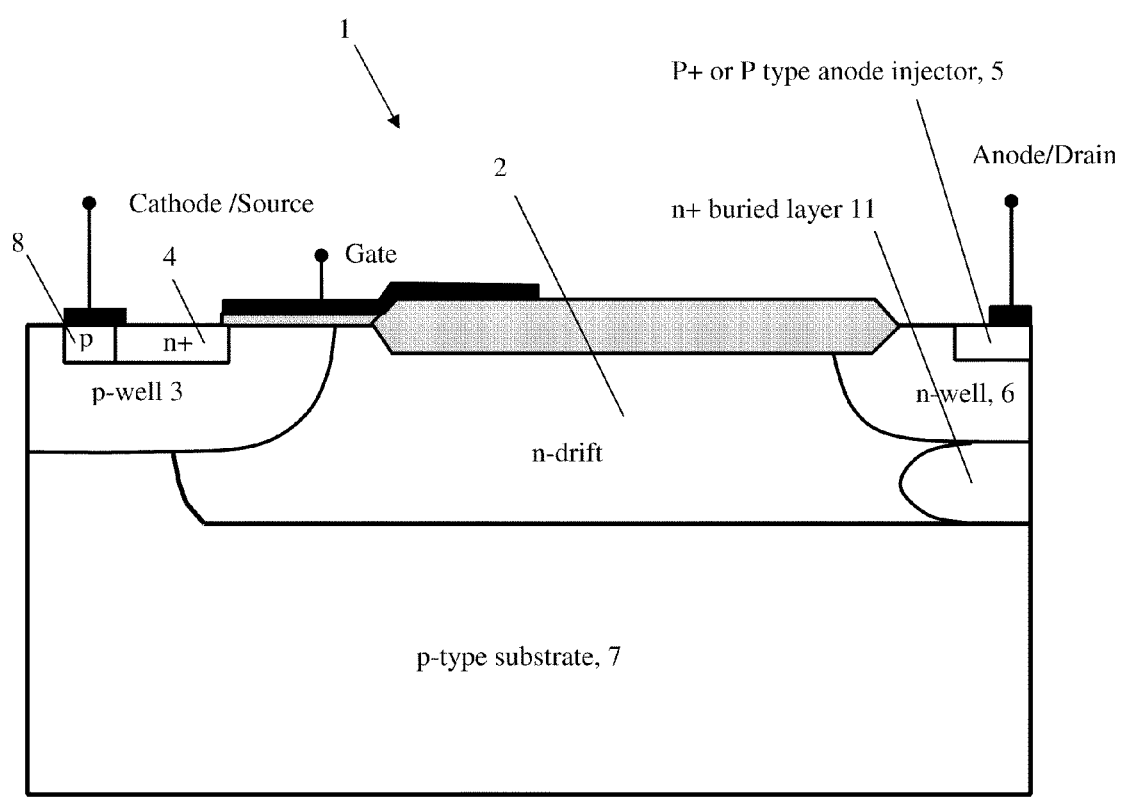
FIG. 19 shows schematically a cross-section view of a first example of a LIGBT according to the third arrangement of the invention.

FIG. 19 shows schematically a cross-section view of a first example of a high voltage/power LIGBT device 1 according to the third arrangement, this example using the bulk technology. The device 1 has a n-drift region 2 having first and second ends. At the first end of the drift region there is p-well region 3 which is further attached to an n+ cathode region 4, and to which a cathode terminal is fixed in use. The cathode region, 4 is shorted together with a p type region 8 which is in direct contact to the p-well 3. The MOS gate layers having a gate terminal attached thereto in use are formed over the p-well 3. At the second end of the drift region 2 there is a p+ and/or p type anode injector 5 to which an anode terminal is fixed in use. In this example, a n-well buffer region 6 is provided at the second end of the drift region 2 to separate the drift region 2 from the anode region 5. The active layers and regions described above are formed on a p− silicon substrate 7.

Below the p+ or p type anode injector, there is provided a floating n+ buried region, 11. This region is floating as it is not contacted to the anode terminal. The floating n+ buried region is preferably made at the same time (within the same process step) with other buried layers in the process to save cost.

The n+ buried region 11 in the device according to the third arrangement acts both as an Auger recombination centre to lower the plasma injected in the on-state and an injection efficiency control. Both lead to an increased turn-off speed and reduced turn-off losses. The doping, the thickness and the length of the buried layer shown in FIG. 19 can be adjusted to allow a favourable trade-off between the on-state and turn-off performance.

Figure 20:
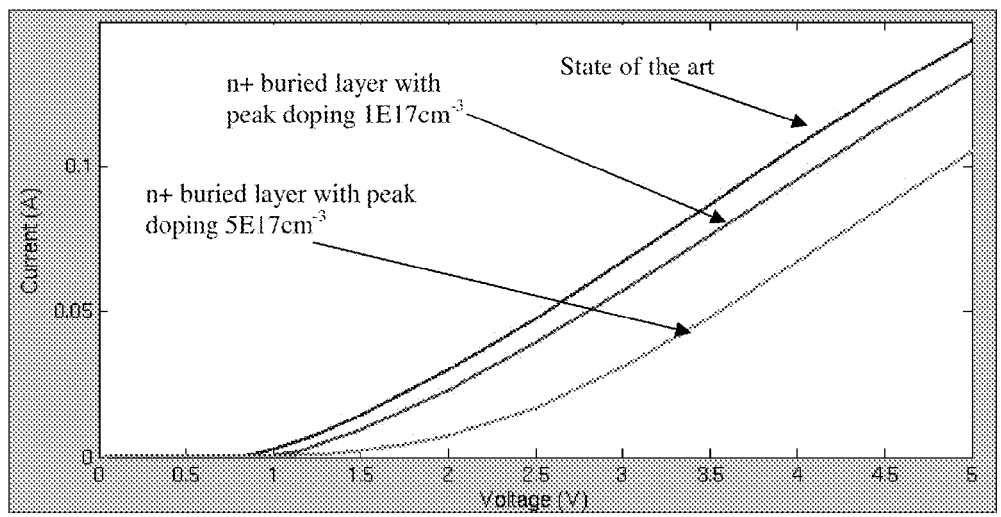
FIGS. 20-22 show the I-V on-state characteristics, the hole concentration (plasma concentration) and turn-off characteristics and energy losses for a state-of-the-art LIGBT and the device as shown in FIG. 19 according to the third arrangement of the invention.
Figure 21:
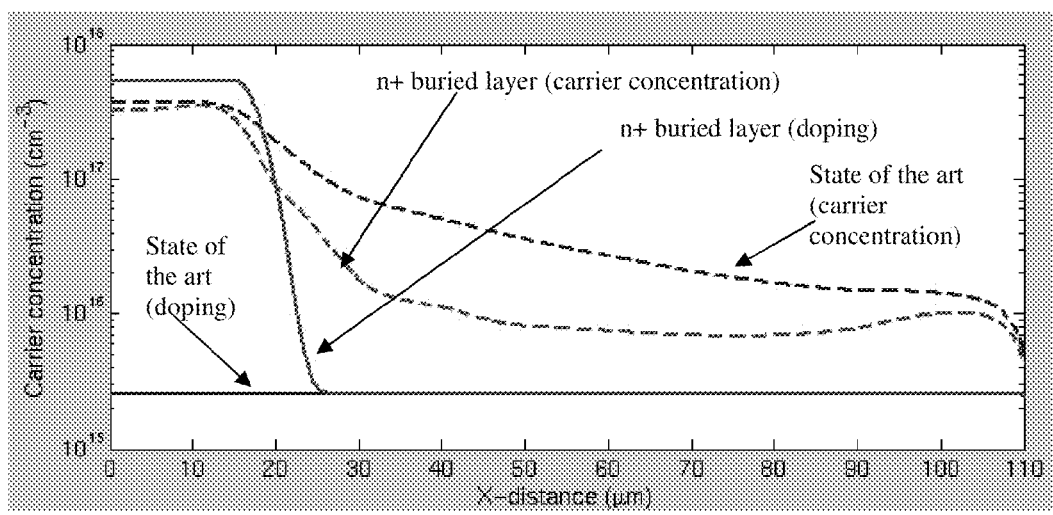

FIG. 20 shows the I-V characteristics in the on-state for a state-of-the-art LIGBT and two examples of the device shown in FIG. 19 with the floating n+ buried layer peak doping concentrations of $1 \times 10^{17}$ cm$^{-3}$ and $5 \times 10^{17}$ cm$^{-3}$ respectively. As can be seen, the on-state current for the same voltage drop and same gate voltage decreases for the two examples according to the third arrangement compared to the state-of-the-art LIGBT. This is due to the lower gain of the pnp transistor, which leads to lower plasma level (FIG. 21) and hence less conductivity modulation in the n-drift region, and p-substrate in the two examples according to the second arrangement. The higher the doping of the n+ buried layer, the lower the plasma level and hence the lower the on-state current.

Figure 22:
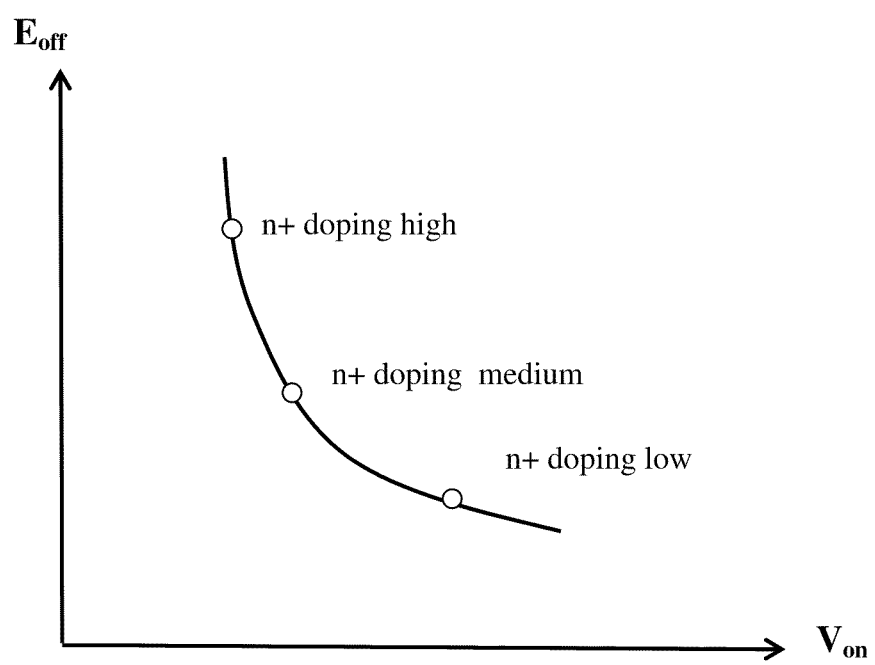

The lower on-state performance is however accompanied by much faster switching speed and lower turn-off losses for the two examples according to the third arrangement compared to the state-of-the-art LIGBT. This is shown in FIG. 22. The higher the doping of the n+ buried layer, the lower the plasma level and hence the higher the turn-off speed and the lower the energy losses as shown in FIG. 22.

FIG. 23 shows schematically the trade-off between the turn-off energy losses and on-state voltage drop for the device shown in FIG. 19 when the doping concentration of the buried n+ layer changes. As the doping increases, the Auger recombination is stronger, and the injection efficiency of the anode junction is reduced, resulting in lower plasma. Consequently, the on-state voltage increases for the same on-state current level, while the turn-off energy losses are sharply reduced.

Figure 24:
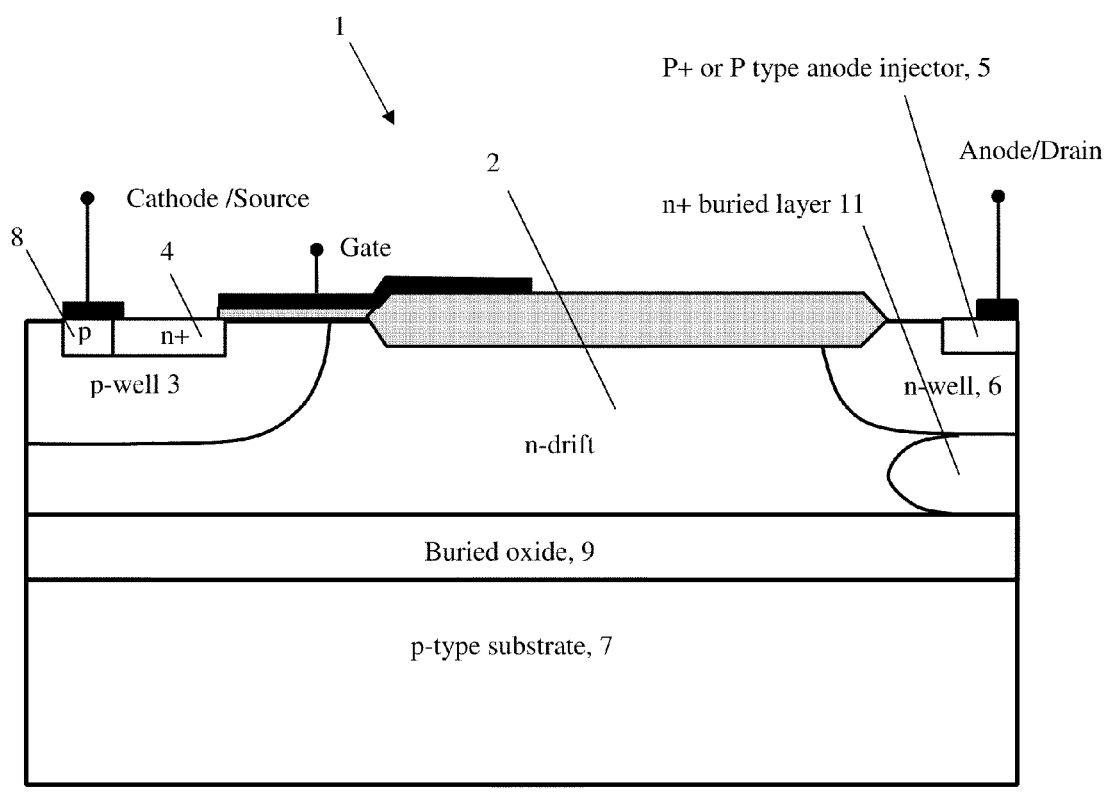
FIG. 24 shows schematically a cross-section view of a second example of a LIGBT according to the third arrangement of the invention.

FIG. 24 shows schematically a cross-section of a second example of a high voltage/power LIGBT device 1 embodiment of the third arrangement o. Compared to the bulk technology example of FIG. 19, in the second example Silicon on insulator (SOI) is used. This technology is based on a buried oxide 9 to isolate the p/n substrate, 7 from the upper layers. Other parts are the same and will not be discussed further herein.

Figure 25:
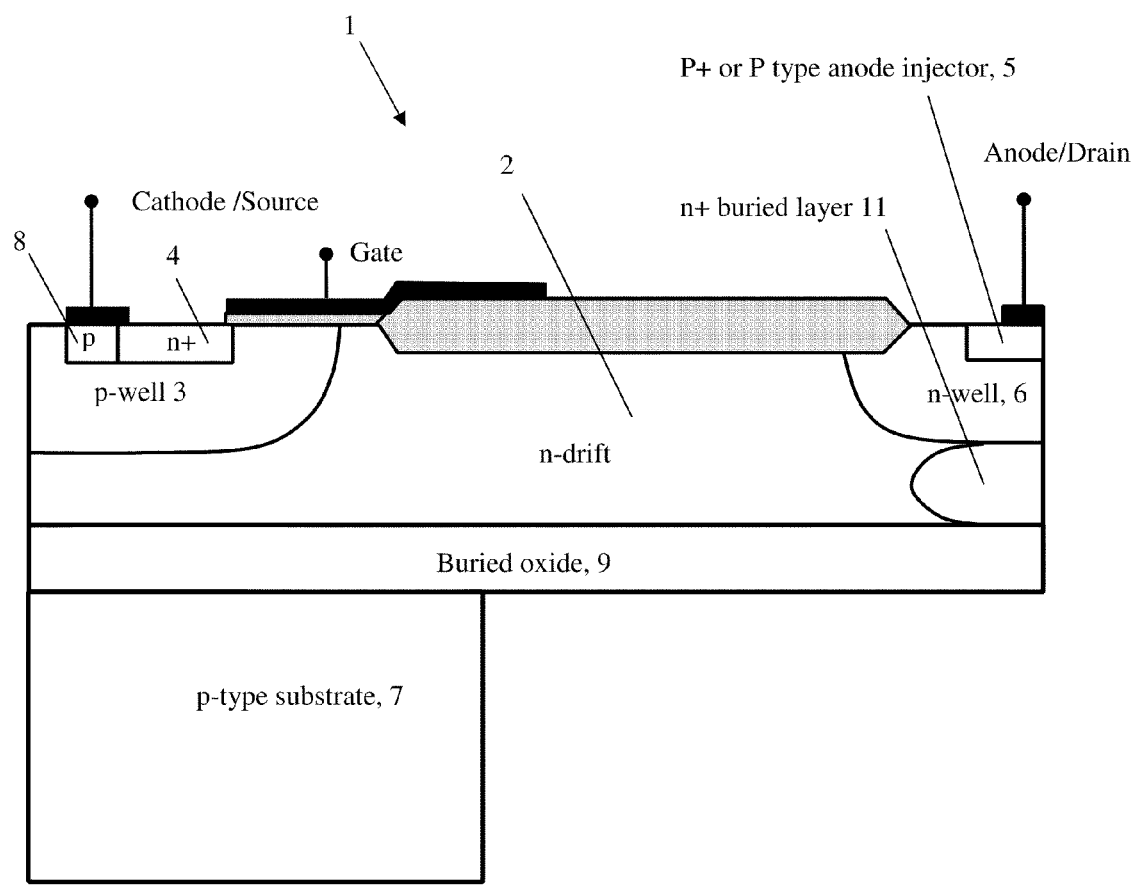
FIG. 25 shows schematically a cross-section view of a third example of a LIGBT according to the third arrangement of the invention.

FIG. 25 shows schematically a cross-section of a third example of another high voltage/power LIGBT device 1 embodiment of the third arrangement.

This example uses so-called membrane technology in which, compared to the FIG. 24 example, the silicon substrate 7 has been selectively removed or is otherwise selectively absent under the drift region 2 to allow an increase in the breakdown voltage. This membrane technology is described more fully in the above-mentioned WO-A-02/25700, U.S. Pat. No. 6,703,684, US-A-2004-0084752 and US-A-2004-0087065.

Figure 26:
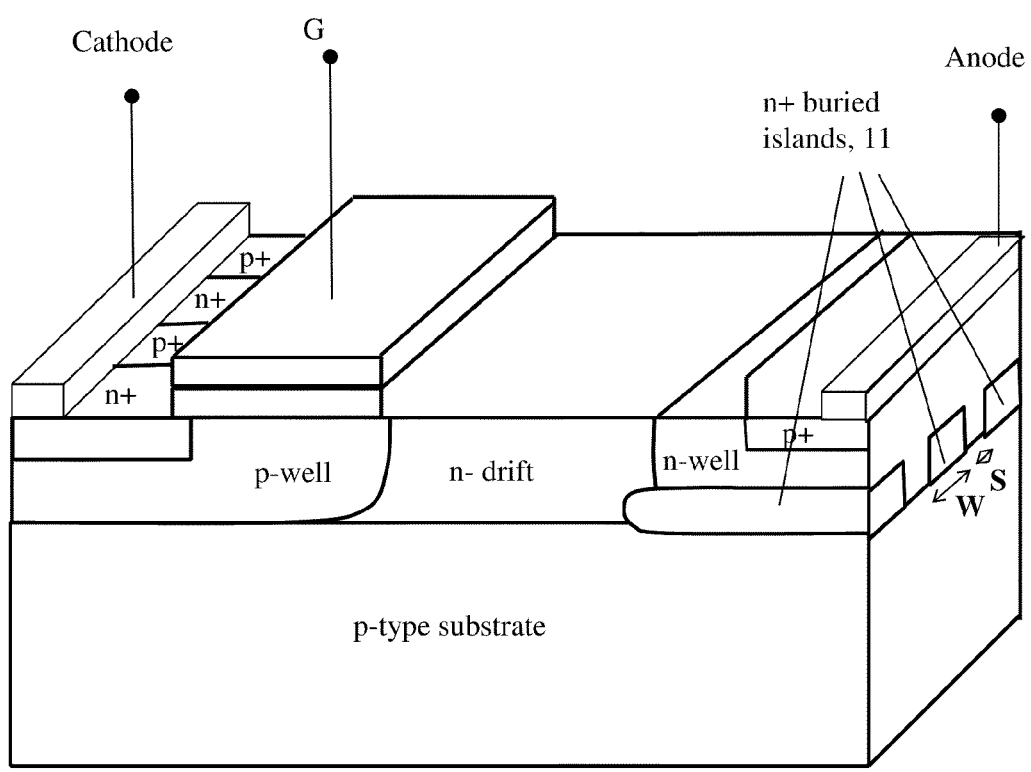
FIG. 26 shows schematically a perspective view of a fourth example of a LIGBT according to the third arrangement of the invention.
Figure 27:
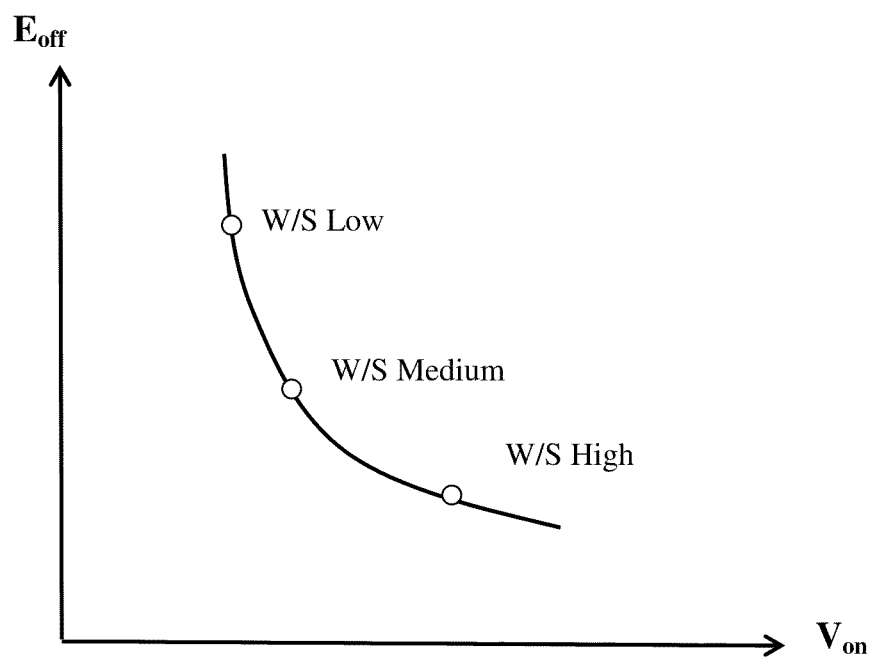
FIG. 27 shows schematically the trade-off between energy losses and on-state voltage drop for the device shown in FIG. 12 when the geometrical aspect ratio of the n+ buried layer varies.

FIG. 26 shows schematically a perspective view of a fourth example of another high voltage/power LIGBT device 1 embodiment of the third arrangement. This example uses a discontinuous n+ buried layer to adjust the Auger recombination and injection efficiency of the anode junction. The aspect ratio w/s (see FIG. 26) determines the injection efficiency of the junction and thus determines the trade-off between the on-state and turn-off performance as shown in FIG. 27.

Figure 30:
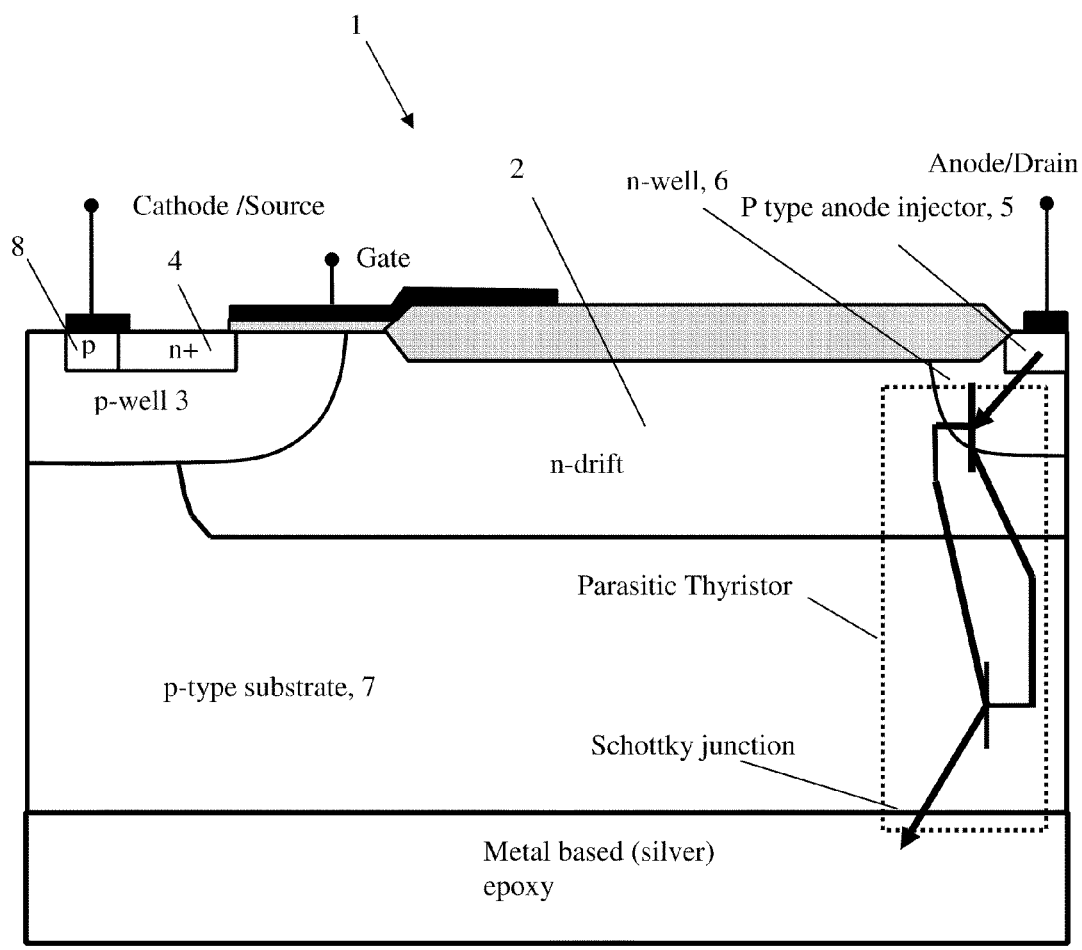
FIG. 30 shows the presence of a parasitic thyristor of an embodiment of the fourth arrangement in a device embodiment of the first arrangement.
Figure 31:
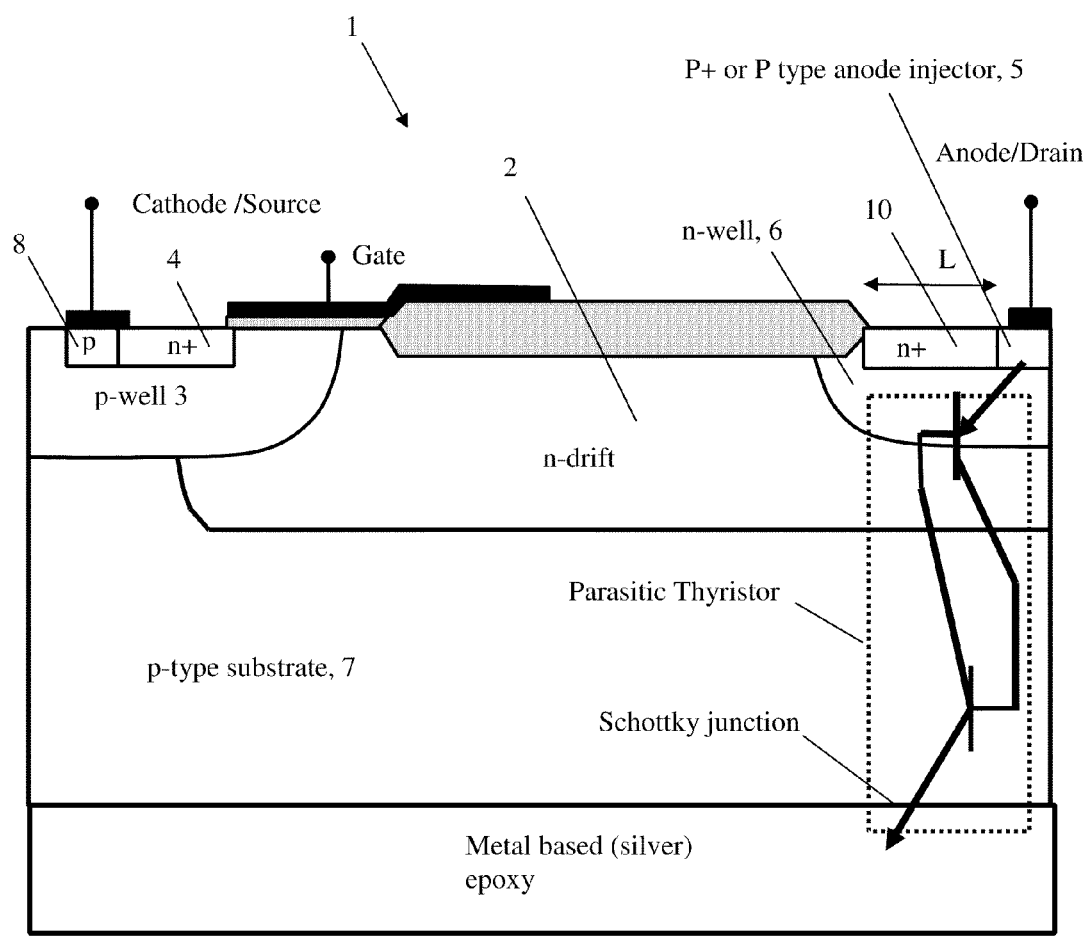
FIG. 31 shows the presence of a parasitic thyristor of an embodiment of the fourth arrangement in a device embodiment of the second arrangement.
Figure 32:
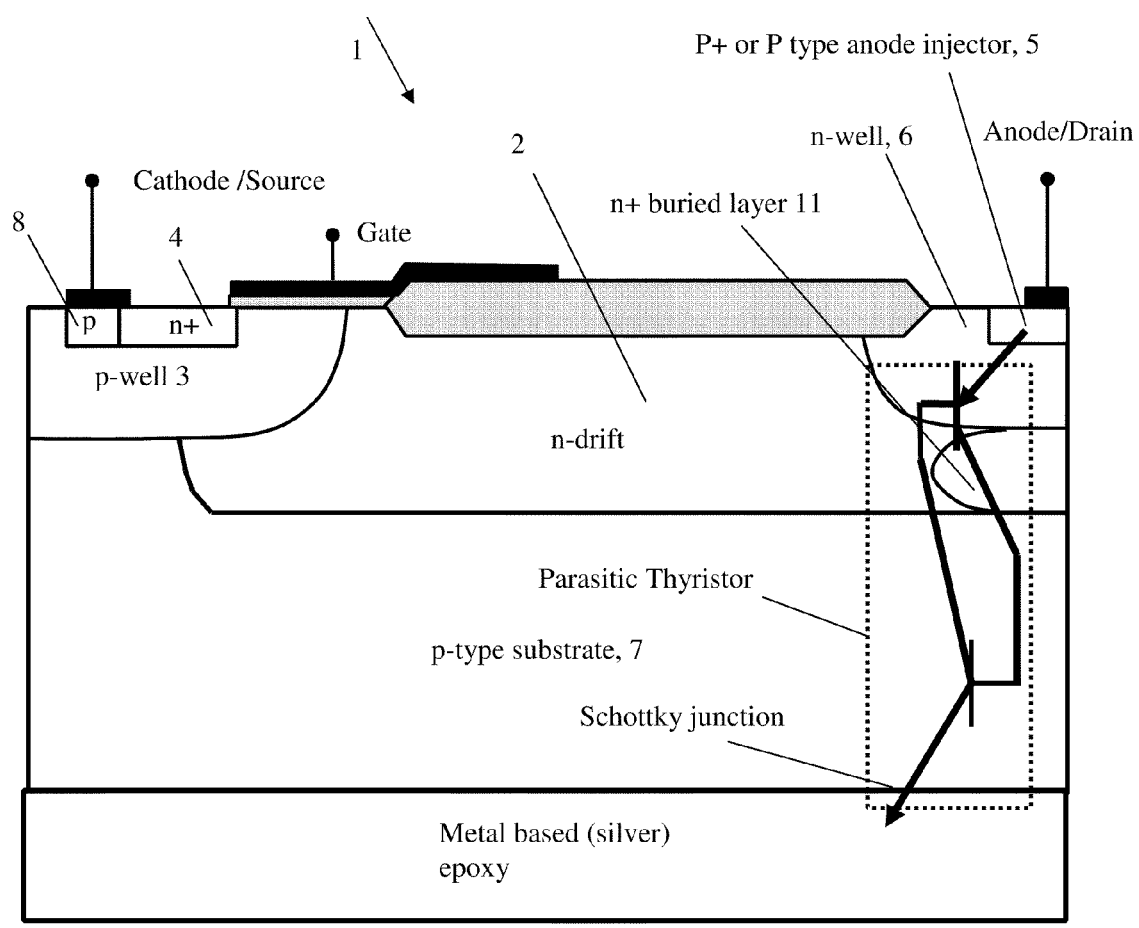
FIG. 32 shows the presence of a parasitic thyristor of an embodiment of the fourth arrangement in a device embodiment of the third arrangement.

FIGS. 30, 31 and 32 show schematically the presence of the parasitic thyristor in the devices according to the fourth arrangement in combination with, respectively, the first, second and third arrangements.

FIG. 30 shows schematically the presence of the parasitic thyristor in a high voltage/power LIGBT device comprising a lowly-doped P-type anode injector, 5. As discussed above, this type of anode injector reduces injection efficiency and therefore reduces the gain of both the second vertical pnp transistor and the lateral pnp transistor. By reducing the gain of the second vertical transistor the action of the parasitic thyristor is suppressed: if the sum of the current gain of the second vertical pnp transistor $\alpha_V$ and that of the parasitic npn transistor αp is smaller than unity, then the thyristor remains passive.

FIG. 31 shows schematically the presence of the parasitic thyristor in a high voltage/power LIGBT device comprising a floating n+ surface region, 10. As discussed above, such a region reduces injection efficiency and/or reduces the amount of plasma through Auger recombination both of which may reduce the gain of both the second vertical pnp transistor and/or the lateral pnp transistor. By reducing the gain of the second vertical transistor the action of the parasitic thyristor is suppressed: If the sum of the current gain of the second vertical pnp transistor $\alpha_V$ and that of the parasitic npn transistor $\alpha_p$ is smaller than unity, then the thyristor remains passive.

FIG. 32 shows schematically the presence of the parasitic thyristor in a high voltage/power LIGBT device comprising a floating n+ buried layer, 11. As discussed above, such a region reduces injection efficiency and therefore reduces the gain of both the second vertical pnp transistor and/or the lateral pnp transistor. By reducing the gain of the second vertical transistor the action of the parasitic thyristor is suppressed: if the sum of the current gain of the second vertical pnp transistor $\alpha_V$ and that of the parasitic npn transistor $\alpha_p$ is smaller than unity, then the thyristor remains passive.

In a further embodiment, there is provided a method of forming an IC comprising an LIGBT and at least a MOSFET, the MOSFET preferably being a CMOS-based MOSFET, the method comprising processing to form the LIGBT, the processing comprising: forming a first contact region of a first conductivity type located preferably within a buffer region of a second conductivity type; forming a second contact region of said first conductivity type; forming a source region of said second, opposite conductivity type located within a well region of said first conductivity type and connected electrically to said second contact region; forming a lateral drift region of the second conductivity type located between the said well region and said first contact region (or buffer region, if present), said lateral drift region to be depleted of mobile carriers during an off-state blocking mode of the LIGBT and able to conduct charge during an on-state conducting mode of the LIGBT; and forming an insulated gate above and in direct contact to said well region, said insulated gate to control charge in a channel region between said lateral drift region and said source region of said second conductivity type and to thereby control flow of charge within the said drift region, wherein said forming said first contact region comprises doping said first contact region to have a peak dopant concentration lower than about $1\times10^{19}/cm^3$ to thereby form a charge injection region to inject charge towards said lateral drift region, the method comprising: forming said second contact region during the same process step used to form a source or drain of said MOSFET to provide a peak doping concentration of said second contact region and said source or drain of said MOSFET in excess of $1\times10^{19}/cm^3$ and preferably above $1\times10^{20}/cm^3$.

In a still further embodiment, a method is provided of forming an IC comprising an LIGBT, said IC further comprising a transistor, said transistor having a buffer region of the first conductivity type between a drift region of said transistor and a contact region of said transistor, the method comprising processing to form the LIGBT, the processing comprising: forming a first contact region of a first conductivity type preferably located within a buffer region of a second conductivity type; forming a second contact region of said first conductivity type; forming a source region of said second, opposite conductivity type located within a well region of said first conductivity type and connected electrically to said second contact region; forming a lateral drift region of the second conductivity type located between the said well region and the first contact region or, if present, said buffer region, said lateral drift region to be depleted of mobile carriers during an off-state blocking mode of the LIGBT and able to conduct charge during an on-state conducting mode of the LIGBT; and forming an insulated gate placed above and in direct contact to said well region, said insulated gate to control charge in a channel region between said lateral drift region and said source region of said second conductivity type and to thereby control flow of charge within the said drift region, wherein said forming said first contact region comprises doping said first contact region to have a peak dopant concentration lower than about $1\times10^{19}/cm^3$ to thereby form a charge injection region to inject charge towards said lateral drift region, the method comprising: forming said second contact region of said LIGBT during the same process step as said buffer region of said transistor or forming said first contact region of said LIGBT during the same process step as said contact region of said transistor. The LIGBT of this embodiment may be as defined by the first aspect above.

The following paragraphs describe LIGBT configurations and related ICs and methods. Alternative devices, ICs and methods may be defined by replacing each reference to an LIGBT in these paragraphs by a more general reference to a high voltage or high power lateral electronic device. Furthermore, any one of the configurations below may be combined with any combination or one or more of the optional features of the first to thirteenth aspects described above.

One configuration of an LIGBT may comprise: at least two contact regions of a first conductivity type; at least one semiconductor well region; a region (which may also be a contact region) of a second, opposite conductivity type located within a said semiconductor well region (e.g., the first contact region) of said first conductivity type; a lateral drift region of the second conductivity type to conduct charge from a first said contact region towards a second said contact region; and a gate to control conductivity in a channel region between said lateral drift region and said region of said second conductivity type within said semiconductor well region and to thereby control flow of said charge from one of said first and second contact regions to the other of said first and second contact regions, wherein said one of said contact regions is a charge injection region to inject charge towards said lateral drift region and has a peak dopant concentration lower than about $1\times10^{19}/cm^3$. The drift region is preferably separated from the at least one of the contact regions by a well or buffer surrounding each of the at least one contact regions. The lateral drift region charge conduction may be via an intervening region e.g. buffer. The charge injection contact region may extend vertically, i.e., to a depth, of more than 1 um, preferably about 3 um to about 20 um. Buffer regions as mentioned throughout this specification may be used to limit penetration of an electric field, e.g., to avoid punch-through in an off-state blocking mode of the LIGBT.

The peak dopant concentration of said charge injection region may be greater than about $5\times10^{17}/cm^3$.

The LIGBT may comprise a contact on said charge injection region, wherein said contact ohmically contacts said second contact region.

The LIGBT may comprise a semiconductor wafer substrate of said first conductivity type, said semiconductor wafer substrate comprising said lateral drift region, wherein said substrate extends under substantially the entire lateral extent of the LIGBT. This generally corresponds to bulk silicon device. However, there may be a lateral insulator layer within the LIGBT below the drift region, for example where a SOI substrate is used. The insulator may be e.g. oxide such as SiO2, or sapphire. Semiconductor below the insulator may be selectively present to allow an increase in the breakdown voltage, i.e., using membrane technology.

The LIGBT may comprise a charge injection contact on said charge injection region, wherein efficiency of said injection into the lateral drift region of charge received by said charge injection region from said charge injection contact is below about 1, more preferably in the range of about 0.5 to about 0.9.

An Integrated circuit (IC) comprising the LIGBT may further comprise a MOSFET (separate from the LIGBT), wherein said charge injection region has substantially the same peak dopant concentration as the source or drain of said MOSFET, the MOSFET preferably being a CMOS MOSFET.

A method of forming the IC may comprise processing to form the LIGBT, the processing comprising: forming at least two contact regions of a first conductivity type; forming at least one semiconductor well region; forming a region (which may also be a contact region) of a second, opposite conductivity type located within a said semiconductor well region (which may be the first contact region) of said first conductivity type; forming a lateral drift region of the second conductivity type to conduct charge from a first said contact region towards a second said contact region; forming a gate to control conductivity in a channel region between said lateral drift region and said region of said second conductivity type within said semiconductor well region and to thereby control flow of said charge from one of said first and second contact regions to the other of said first and second contact regions; and doping said one of said contact regions to have a peak dopant concentration lower than about $1\times10^{19}/cm^3$ to form said one of said contact regions as a charge injection region to inject charge towards said lateral drift region, the method comprising: forming said other contact region during the same process step used to form the source or drain of said MOSFET. The formation of any region as mentioned above may be by doping, e.g., by diffusion.

An alternative method of forming an IC comprising the LIGBT may comprise processing to form the LIGBT, said IC further comprising a transistor, said transistor having a buffer region of the first conductivity type between a drift region of said transistor and a contact region of said transistor, the method comprising processing to form the LIGBT, the processing comprising: forming at least two contact regions of a first conductivity type; forming at least one semiconductor well region; forming a region (which may also be a contact region) of a second, opposite conductivity type located within a said semiconductor well region (which may be the first contact region) of said first conductivity type; forming a lateral drift region of the second conductivity type to conduct charge from a first said contact region towards a second said contact region; forming a gate to control conductivity in a channel region between said lateral drift region and said region of said second conductivity type within said semiconductor well region and to thereby control flow of said charge from one of said first and second contact regions to the other of said first and second contact regions; and doping said one of said contact regions to have a peak dopant concentration lower than about $1\times10^{19}/cm^3$ to form said one of said contact regions as a charge injection region to inject charge towards said lateral drift region, the method comprising: forming said other contact region of said LIGBT during the same process step as said contact region of said transistor. The transistor may be a field-effect transistor (FET), which may be CMOS-based.

Another configuration of an LIGBT may comprise: at least two contact regions of a first conductivity type; at least one semiconductor well region; a region (which may be a contact region) of a second, opposite conductivity type located within a said semiconductor well region (which may be the first contact region) of said first conductivity type; a lateral drift region of the second conductivity type to conduct charge from a first said contact region towards a second said contact region; and a gate to control conductivity in a channel region between said lateral drift region and said region of said second conductivity type within said semiconductor well region and to thereby control flow of said charge from one of said first and second contact regions to the other of said first and second contact regions, wherein said one of said contact regions is a charge injection region to inject charge towards said lateral drift region and has a peak dopant concentration lower than a peak dopant concentration of said other contact region.

An LIGBT may comprise: at least two contact regions of a first conductivity type; at least one semiconductor well region; a region (which may be a contact region) of a second, opposite conductivity type located within a said semiconductor well region (which may be the first contact region) of said first conductivity type; a lateral drift region of the second conductivity type to conduct charge from a first said contact region towards a second said contact region; and a gate to control conductivity in a channel region between said lateral drift region and said region of said second conductivity type within said semiconductor well region and to thereby control flow of said charge from one of said first and second contact regions to the other of said first and second contact regions, wherein said one of said contact regions is a charge injection region to inject charge towards said lateral drift region, the LIGBT further comprising: a region of said second conductivity type adjacent and below said charge injection contact region; and a floating semiconductor region of said second conductivity type located laterally adjacent said charge injection contact region and having a higher peak dopant concentration than said region of said second conductivity type adjacent and below said charge injection contact region (the floating semiconductor region and the region of said second conductivity type may be separate regions doped in different processing steps), wherein said floating semiconductor region extends substantially continuously along substantially a complete length of said charge injection contact region in a lateral direction. ('Adjacent' throughout this specification preferably means directly adjacent, i.e., in contact). The floating region may extend to a depth of about 0.1 um to about 1 um.

In this LIGBT, said region of said second conductivity type adjacent and below said charge injection contact region may be the lateral drift region. The region of said second conductivity type adjacent and below said charge injection contact region may be a said semiconductor well region. The floating semiconductor region may be located to at least partially obstruct lateral charge flow from said charge injection semiconductor region and to allow charge to flow vertically from said charge injection semiconductor region and to said lateral drift region. The floating semiconductor region may contact said charge injection semiconductor region.

The LIGBT may further comprise a field oxide region over said lateral drift region between said first and second contact regions, wherein said floating semiconductor region extends to said field oxide region.

The floating semiconductor region may have a peak dopant concentration in a range of about $1\times10^{20}$/cm$^3$ to about $1\times10^{21}$/cm$^3$.

Preferably, the LIGBT comprises a semiconductor wafer substrate of said first conductivity type, said semiconductor wafer substrate comprising said lateral drift region, wherein said substrate extends under substantially the entire lateral extent of the LIGBT. Thus, the LIGBT may be a bulk silicon device; alternatively however, an insulator layer may be present under the drift region for example by using SOI or membrane technology.

An IC comprising the LIGBT preferably further comprises a MOSFET such as a CMOS MOSFET.

A method of forming the LIGBT comprises processing to form the LIGBT, the processing comprising: forming at least two contact regions of a first conductivity type; forming at least one semiconductor well region; forming a region (which may also be a contact region) of a second, opposite conductivity type located within a said semiconductor well region (which may be the first contact region) of said first conductivity type; forming a lateral drift region of the second conductivity type to conduct charge from a first said contact region towards a second said contact region; and forming a gate to control conductivity in a channel region between said lateral drift region and said region of said second conductivity type within said semiconductor well region and to thereby control flow of said charge from one of said first and second contact regions to the other of said first and second contact regions, wherein said one of said contact regions is a charge injection region to inject charge towards said lateral drift region; forming a region of said second conductivity type adjacent and below said charge injection contact region; and forming a floating semiconductor region of said second conductivity type located laterally adjacent said charge injection contact region and having a higher peak dopant concentration than said region of said second conductivity type adjacent and below said charge injection contact region (the floating semiconductor region and the region of said second conductivity type may be separate regions doped in different processing steps), wherein said floating semiconductor region extends substantially continuously along substantially a complete length of said charge injection contact region in a lateral direction, the method comprising: forming said floating semiconductor region at the same time as said region of said second conductivity type within said semiconductor well region of said first conductivity type. (At the same time generally means in the same process step).

A further configuration of an LIGBT comprises: at least two contact regions of a first conductivity type; at least one semiconductor well region; a region (which may be a contact region) of a second, opposite conductivity type located within a said semiconductor well region (which may be the first contact region) of said first conductivity type; a lateral drift region of the second conductivity type to conduct charge from a first said contact region towards a second said contact region; and a gate to control conductivity in a channel region between said lateral drift region and said region of said second conductivity type within said semiconductor well region and to thereby control flow of said charge from one of said first and second contact regions to the other of said first and second contact regions, wherein said one of said contact regions is a charge injection region to inject charge towards said lateral drift region, the LIGBT further comprising: a buried floating semiconductor region below said charge injection semiconductor region and adjacent said lateral drift region, the buried floating semiconductor region being of the second conductivity type and more highly doped than said drift region. (Buried generally means under and not extending to the upper surface of the LIGBT, preferably having higher peak dopant concentration than all regions of the same conductivity type as the floating semiconductor region that contact the floating semiconductor region).

The buried floating semiconductor region may contact the charge injection semiconductor region. The charge injection contact region may be within a said well region that is above and contacts said buried floating semiconductor region. The buried floating semiconductor region may have a peak dopant concentration in a range of about $1\times10^{18}$/cm$^3$ to about $1\times10^{20}$/cm$^3$.

The LIGBT may comprise a semiconductor wafer substrate of the first conductivity type, said semiconductor wafer substrate comprising said lateral drift region, wherein said substrate extends under substantially the entire lateral extent of the LIGBT. Thus, the LIGBT may be a bulk silicon device; in other examples of this configuration however the LIGBT may use SOI or membrane technology.

As for each LIGBT configuration described above, the LIGBT may be comprised in an IC.

A method of suppressing thyristor latch-up in a bulk silicon LIGBT comprising a thyristor, said thyristor including a parasitic bipolar transistor formed by a Schottky contact between a substrate of said LIGBT and an underlying metal contact to said substrate (the metal contact may be a metal-filled glue attaching said substrate to a chip carrier such as a leadframe), comprises: selecting a current gain $\alpha v$ for a vertical transistor of said LIGBT having emitter, base and collector regions comprising a charge injection contact of said LIGBT, said drift region and said substrate, such that: $\alpha v<1-\alpha p$ where $\alpha p$ is a current gain of said parasitic bipolar transistor and $\alpha v$ is a current gain of said vertical transistor. This method may be extended to result in fabrication of the LIGBT having inhibited thyristor latch-up, the method comprising: selecting said current gain $\alpha v$ such that $\alpha v<1-\alpha p$; and fabricating a said LIGBT with a said vertical bipolar transistor having said selected current gain. There may thus be provided an LIGBT fabricated according to this method. Such a method may be implemented by/with each of the above LIGBT configurations.

A configuration of an LIGBT with suppressed thyristor latch-up is now described, the LIGBT fabricated from bulk silicon and having a drift region of a first conductivity type over a substrate of a second, opposite conductivity type, wherein said substrate is electrically coupled to a package of said LIGBT by an underlying metallic contact region (e.g., metal-filled glue), wherein a parasitic bipolar transistor is formed by a Schottky contact between said metal-filled glue and said substrate, wherein said parasitic transistor has a current gain $\alpha p$, wherein said LIGBT comprises a further, vertical bipolar transistor having emitter, base and collector regions comprising a charge injection contact of said LIGBT, said drift region and said substrate, wherein said vertical transistor has a current gain of $\alpha v$, wherein said vertical bipolar transistor and said parasitic bipolar transistor have opposite conductivity types and are connected, in said LIGBT, as a thyristor, and wherein said current gain of said vertical transistor satisfies $\alpha v<1-\alpha p$ at a temperature of 20° C. and with a current through said drift region of at least 0.5 Amp such that a latch-up of said thyristor is suppressed. Such a configuration may be found in combination with and/or achieved by any one of the above LIGBT configurations.

Arrangements and more specific embodiments of the present invention have been described with particular reference to the examples illustrated. However, it will be appreciated that variations and modifications may be made to the examples described within the scope of the present invention, and no doubt many other effective alternatives will occur to the skilled person. It will thus be understood that the invention is not limited to the described embodiments and encompasses modifications apparent to those skilled in the art lying within the spirit and scope of the claims appended hereto.

The invention claimed is:

1. Lateral Insulated Gate Bipolar Transistor (LIGBT) comprising:
   a first contact region of a first conductivity type;
   a second contact region of said first conductivity type;
   a source region of a second, opposite conductivity type located within a well region of said first conductivity type and connected electrically to said second contact region;
   a lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and
   an insulated gate placed above and in direct contact to said well region, said insulated gate to control charge in a channel region between said lateral drift region and said source region of said second conductivity type and to thereby control flow of charge within the said drift region, wherein
   said first contact region is a charge injection region to inject charge towards said lateral drift region and has a peak doping concentration lower than about $1\times10^{19}/cm^3$.

2. LIGBT according to claim 1, wherein said peak doping concentration of said charge injection region is greater than about $5\times10^{17}/cm^3$.

3. LIGBT according to claim 1, wherein a terminal makes an ohmic contact to said charge injection region.

4. LIGBT according to claim 1, comprising a semiconductor wafer substrate of said first conductivity type, said semiconductor wafer substrate comprising said lateral drift region, wherein said substrate extends under substantially the entire lateral extent of the LIGBT.

5. LIGBT according to claim 1, comprising a silicon-on-insulator (SOI) substrate.

6. LIGBT according to claim 1, the LIGBT having a layer comprising said drift region, the LIGBT comprising a semiconductor substrate region of said first conductivity type below said layer, at least a portion of said drift region not located directly over said semiconductor substrate.

7. LIGBT according to claim 1, wherein the junction efficiency of the junction formed between said charge injection region and said lateral drift region is below about 1, more preferably in the range of about 0.5 to about 0.9.

8. The LIGBT according to claim 1, in an Integrated circuit (IC), the IC further comprising at least a MOSFET, wherein said charge injection region has substantially the same doping concentration as the source or drain of said MOSFET.

9. Lateral Insulated Gate Bipolar Transistor (LIGBT) comprising:
   a first contact region of a first conductivity type;
   a second contact region of said first conductivity type;
   a source region of said second, opposite conductivity type located within a well region of said first conductivity type and connected electrically to said second contact region;
   a lateral drift region of the second conductivity type located between the said well region and said first contact region, said lateral drift region to be depleted of mobile carriers during an off-state blocking mode of the LIGBT and able to conduct charge during an on-state conducting mode of the LIGBT; and
   an insulated gate placed above and in direct contact to said well region, said insulated gate to control charge in a channel region between said lateral drift region and said source region of said second conductivity type and to thereby control flow of charge within the said drift region, wherein
   said first contact region is a charge injection region to inject charge towards said lateral drift region and has a dopant concentration lower than a dopant concentration of said second contact region.

10. Lateral Insulated Gate Bipolar Transistor (LIGBT) comprising:
   a first contact region of a first conductivity type located within a neighbouring region of second conductivity type;
   a second contact region of a first conductivity type;
   a source region of a second, opposite conductivity type located within a well region of first conductivity type and connected electrically to said second contact region;

a lateral drift region of the second conductivity type placed between the said well region and said first contact region, said lateral drift region to be depleted of mobile carriers at breakdown voltage during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region; and a floating semiconductor region of said second conductivity type located laterally adjacent said first contact region and having a higher doping concentration than said neighbouring region of said second conductivity type, wherein said first contact region is a charge injection region and said floating semiconductor region extends substantially continuously along substantially a complete length of said charge injection contact region in a lateral direction.

11. LIGBT according to claim 10, wherein charge injection from the said charge injection region is reduced due to the presence of the floating region due to decrease in injection efficiency and/or Auger recombination.

12. LIGBT according to claim 10, where said floating region is formed during the same process step as said source region.

13. LIGBT according to claim 10, wherein said floating semiconductor region contacts said charge injection semiconductor region.

14. LIGBT according to claim 10, wherein said floating semiconductor region has a doping concentration in a range of about $1\times10^{19}/cm^3$ to about $1\times10^{21}/cm^3$.

15. LIGBT according to claim 10, comprising a semiconductor wafer substrate of said first conductivity type, said semiconductor wafer substrate comprising said lateral drift region, wherein said substrate extends under substantially the entire lateral extent of the LIGBT.

16. LIGBT according to claim 10, comprising a silicon-on-insulator (SOI) substrate.

17. LIGBT according to claim 10, the LIGBT having a layer comprising said drift region, the LIGBT comprising a semiconductor substrate region of said first conductivity type below said layer, at least a portion of said drift region not located directly over said semiconductor substrate.

18. The LIGBT according to claim 10, in an Integrated circuit (IC), the IC preferably further comprising a MOSFET.

19. Lateral Insulated Gate Bipolar Transistor (LIGBT) comprising:
a first contact region of a first conductivity type as a charge injection semiconductor region;
a second contact region of a first conductivity type;
a source region of a second, opposite conductivity type located within a well region of first conductivity type and connected electrically to said second contact region;
a lateral drift region of the second conductivity type placed between the said well region and said first contact region, said lateral drift region to be depleted of mobile carriers during an off-state blocking mode of the LIGBT and able to conduct charge during on-state conducting mode of the LIGBT;
an insulated gate placed above and in direct contact to said well region, said insulated gate to control the charge in a channel region between said lateral drift region and said source region of said second conductivity type and to thereby control flow of charge within the said drift region; and a buried floating semiconductor region below said charge injection semiconductor region and adjacent said lateral drift region, the buried floating semiconductor region being of the second conductivity type and more highly doped than said lateral drift region.

20. LIGBT according to claim 19, wherein said buried floating semiconductor region contacts the charge injection semiconductor region.

21. LIGBT according to claim 19, wherein said charge injection contact region is within a buffer region that is above and contacts said buried floating semiconductor region.

22. LIGBT according to claim 19, wherein said buried floating semiconductor region has a peak doping concentration in a range of about $1\times10^{18}/cm^3$ to about $1\times10^{20}/cm^3$.

23. LIGBT according to claim 19, comprising a semiconductor wafer substrate of the first conductivity type, said semiconductor wafer substrate comprising said lateral drift region, wherein said substrate extends under substantially the entire lateral extent of the LIGBT.

24. LIGBT according to claim 19, comprising a silicon-on-insulator (SOI) substrate.

25. LIGBT according to claim 19, the LIGBT having a layer comprising said drift region, the LIGBT comprising a semiconductor substrate region of said first conductivity type below said layer, at least a portion of said drift region not located directly over said semiconductor substrate.

26. The LIGBT according to claim 19, in an Integrated circuit (IC).

27. An LIGBT fabricated in bulk silicon and having two surfaces, a first said surface being attached to a first main terminal, a second main terminal and a gate terminal, a second said surface being attached to a back terminal made of a metal enriched epoxy die attach;
said LIGBT further comprising:
a doped substrate of a first conductivity type, extending from the said second surface and having a peak dopant concentration of less than about $1\times10^{17}/cm^3$; and
a drift region of a second, opposite conductivity type over the said doped substrate, the drift region extending to the said first surface,
wherein said substrate is electrically coupled at the said second surface to a package of said LIGBT by an underlying metal enriched epoxy die attach, wherein a parasitic bipolar transistor is formed having an emitter-base junction formed by a Schottky contact between said metal enriched epoxy die attach and said doped substrate, wherein a collector of said parasitic transistor is said drift region and said parasitic bipolar transistor has a current gain αp, wherein said LIGBT comprises a further, vertical bipolar transistor having emitter, base and collector regions comprising a charge injection region of the first conductivity type as the emitter region extending from the said first surface and connected to a terminal, said drift region or a buffer layer of the same conductivity type as that of said drift region as the base region, and said doped substrate region as the collector region, wherein said vertical transistor has a current gain of αv,
wherein said vertical bipolar transistor and said parasitic bipolar transistor have opposite conductivity types and are connected, within said LIGBT, in a thyristor configuration, and wherein said current gain of said vertical transistor satisfies αv<1−αp.

28. The LIGBT of claim 27, wherein said vertical transistor satisfies $\alpha v < 1 - \alpha p$ at a temperature of 20° C. and with a current through said drift region of at least 0.1 Amp.

* * * * *